(12) United States Patent
Yoshioka et al.

(10) Patent No.: US 10,886,479 B2
(45) Date of Patent: Jan. 5, 2021

(54) PHOTOELECTRIC CONVERSION ELEMENT, OPTICAL SENSOR, IMAGING ELEMENT, AND COMPOUND

(71) Applicant: FUJIFILM Corporation, Tokyo (JP)

(72) Inventors: Tomoaki Yoshioka, Kanagawa (JP); Kimiatsu Nomura, Kanagawa (JP); Eiji Fukuzaki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/593,953

(22) Filed: Oct. 4, 2019

(65) Prior Publication Data

US 2020/0035933 A1 Jan. 30, 2020

Related U.S. Application Data

(63) Continuation of application No. PCT/JP2018/014267, filed on Apr. 3, 2018.

(30) Foreign Application Priority Data

Apr. 7, 2017 (JP) ................................. 2017-076571

(51) Int. Cl.
*H01L 51/00* (2006.01)

(52) U.S. Cl.
CPC ...... *H01L 51/0092* (2013.01); *H01L 51/0052* (2013.01); *H01L 51/0065* (2013.01); *H01L 51/0067* (2013.01); *H01L 51/0068* (2013.01); *H01L 51/0069* (2013.01); *H01L 51/0072* (2013.01); *H01L 51/0074* (2013.01)

(58) Field of Classification Search
None
See application file for complete search history.

(56) References Cited

U.S. PATENT DOCUMENTS

| 8,426,850 B2 | 4/2013 | Gresser et al. |
| 2008/0076044 A1 | 3/2008 | Mizukawa et al. |
| 2008/0171271 A1 | 7/2008 | Kim et al. |
| 2014/0097416 A1 | 4/2014 | Lee et al. |

FOREIGN PATENT DOCUMENTS

| JP | H11256056 | 9/1999 |
| JP | 2003064274 | 3/2003 |
| JP | 2003286415 | 10/2003 |
| JP | 2012141618 | 7/2012 |
| WO | 2010133208 | 11/2010 |

OTHER PUBLICATIONS

"Office Action of Korea Counterpart Application", dated Aug. 21, 2020, with English translation thereof, p. 1-p. 6.
"Search Report of Europe Counterpart Application", dated Mar. 20, 2020, pp. 1-6.
Tian-Yi Li et al., "Small Molecule Near-Infrared Boron Dipyrromethene Donors for Organic Tandem Solar Cells" , Journal of American Chemical Society, vol. 139, Sep. 15, 2017, pp. 13636-13639.
"International Search Report (Form PCT/ISA/210) of PCT/JP2018/014267", dated Jun. 12, 2018, with English translation thereof, pp. 1-5.
"Written Opinion of the International Searching Authority (Form PCT/ISA/237) of PCT/JP2018/014267", dated Jun. 12, 2018, with English translation thereof, pp. 1-7.

*Primary Examiner* — Joseph R Kosack
(74) *Attorney, Agent, or Firm* — JCIPRNET

(57) ABSTRACT

The present invention provides a photoelectric conversion element exhibiting excellent responsiveness, and excellent photoelectric conversion efficiency in a case where the photoelectric conversion film is a thin film, an optical sensor, an imaging element which include the photoelectric conversion element, and a compound. The photoelectric conversion element of the present invention includes a conductive film, a photoelectric conversion film, and a transparent conductive film, in this order, in which the photoelectric conversion film contains a compound represented by Formula (1) and having a structure represented by Formula (2).

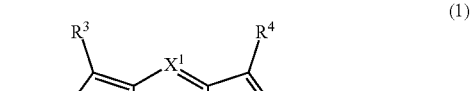

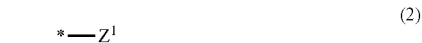

20 Claims, 6 Drawing Sheets

PHOTOELECTRIC CONVERSION ELEMENT, OPTICAL SENSOR, IMAGING ELEMENT, AND COMPOUND

CROSS-REFERENCE TO RELATED APPLICATIONS

This application is a Continuation of PCT International Application No. PCT/JP2018/014267 filed on Apr. 3, 2018, which claims priority under 35 U.S.C. § 119(a) to Japanese Patent Application No. 2017-076571 filed on Apr. 7, 2017. The above application is hereby expressly incorporated by reference, in its entirety, into the present application.

BACKGROUND OF THE INVENTION

1. Field of the Invention

The present invention relates to a photoelectric conversion element, an optical sensor, an imaging element, and a compound.

2. Description of the Related Art

In the related art, a planar solid-state imaging element in which photodiodes (PDs) are two-dimensionally arranged and a signal charge generated in each PD is read out by a circuit is widely used as a solid-state imaging element.

In order to realize a color solid-state imaging element, a structure in which a color filter transmitting light of a specific wavelength is disposed on a light incident surface side of the planar solid-state imaging element is generally used. Currently, a single plate solid-state imaging element in which the color filter transmitting blue (B) light, green (G) light, and red (R) light is regularly arranged on each PD which is two-dimensionally arranged is well known. However, in this single plate solid-state imaging element, light which is not transmitted through the color filter is not used, thus light utilization efficiency is poor.

In order to solve these disadvantages, in recent years, development of a photoelectric conversion element having a structure in which an organic photoelectric conversion film is disposed on a substrate for reading out a signal has progressed. US2014/0097416A discloses, for example, a photoelectric conversion element having a photoelectric conversion film containing the following compounds as such a photoelectric conversion element using the organic photoelectric conversion film.

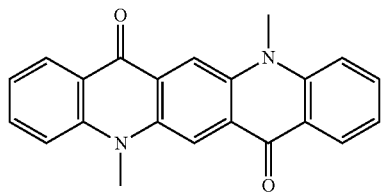 [SMILES: Cn1c2ccccc2c(=O)c2cc3c(cc21)c(=O)c1ccccc1n3C]

SUMMARY OF THE INVENTION

In recent years, further improvements are also required for various characteristics required for a photoelectric conversion element used in an imaging element and an optical sensor, along with demands for improving performance of the imaging element, the optical sensor, and the like.

For example, further improvement in responsiveness is required.

Also, regarding the photoelectric conversion element, it is required that good photoelectric conversion efficiency can be maintained even in a case where thinning of the photoelectric conversion film is advanced (for example, in a case where the photoelectric conversion film is made to be thinner than 100 nm).

The inventor of the present invention has produced a photoelectric conversion element using a compound (for example, the above-described compound) specifically disclosed in US2014/0097416A, and has examined about the responsiveness of the obtained photoelectric conversion element, and photoelectric conversion efficiency in a case where the photoelectric conversion film is a thin film (referred to as the "photoelectric conversion efficiency in a case of a thin film"). As a result, the inventor has found that the characteristics do not necessarily reach the level required recently and further improvement is necessary.

In view of the above-described circumstances, an object of the present invention is to provide a photoelectric conversion element exhibiting excellent responsiveness, and excellent photoelectric conversion efficiency in a case where the photoelectric conversion film is a thin film.

Another object of the present invention is to provide an optical sensor and an imaging element which include a photoelectric conversion element. Still another object of the present invention is to provide a compound applied to the photoelectric conversion element.

The inventor of the present invention has conducted extensive studies on the above-described problems. As a result, the inventor has found that it is possible to solve the above-described problems using a photoelectric conversion film containing a compound having a predetermined structure and an n-type organic semiconductor, and has completed the present invention.

That is, the above-described problems can be solved by means shown below.

(1) A photoelectric conversion element comprising a conductive film, a photoelectric conversion film; and a transparent conductive film, in this order, in which the photoelectric conversion film contains a compound represented by Formula (1) described below, and an n-type organic semiconductor.

(2) The photoelectric conversion element according to (1), in which, in Formula (1) described below, M represents Zn, Cu, Co, Ni, Pt, Pd, Mg, or Ca.

(3) The photoelectric conversion element according to (1) or (2), in which the compound represented by Formula (1) described below is a compound represented by any of Formulae (3) to (6) described below.

(4) The photoelectric conversion element according to (3), in which $Y^{a1}$, $Y^{a2}$, $Y^{b1}$, $Y^{b2}$, $Y^{c1}$, $Y^{c2}$, $Y^{c3}$, $Y^{c4}$, $Y^{d1}$, $Y^{d2}$, $Y^{d3}$, and $Y^{d4}$ each independently represent an oxygen atom or a sulfur atom.

(5) The photoelectric conversion element according to (3) or (4), in which $Z^{a1}$, $Z^{a2}$, $Z^{b1}$, $Z^{b2}$, $Z^{c1}$, $Z^{c2}$, $Z^{c3}$, $Z^{c4}$, $Z^{d1}$, $Z^{d2}$, $Z^{d3}$, and $Z^{d4}$ represent $CR^{26}$, and $R^{26}$ represents a hydrogen atom, an alkyl group, an aryl group, or a heteroaryl group.

(6) The photoelectric conversion element according to any one of (3) to (5), in which, in Formulae (3) to (6) described below, M is Zn.

(7) The photoelectric conversion element according to any one of (3) to (6), in which a molecular weight of the compound represented by any of Formulae (3) to (6) described below is 1200 or less.

(8) The photoelectric conversion element according to any one of claims (1) to (7), in which a molecular weight of the n-type organic semiconductor is 200 to 1200.

(9) The photoelectric conversion element according to any one of (1) to (8), in which the photoelectric conversion film has a bulk hetero structure.

(10) The photoelectric conversion element according to any one of (1) to (9), further comprising one or more interlayers between the conductive film and the transparent conductive film, in addition to the photoelectric conversion film.

(11) An optical sensor comprising the photoelectric conversion element according to any one of (1) to (10).

(12) An imaging element comprising the photoelectric conversion element according to any one of (1) to (10).

(13) A compound represented by any of Formulae (7) to (10) described below.

According to the present invention, it is possible to provide a photoelectric conversion element exhibiting excellent responsiveness, and excellent photoelectric conversion efficiency in a case where the photoelectric conversion film is a thin film.

Also, according to the present invention, it is possible to provide an optical sensor and an imaging element which include a photoelectric conversion element. Also, according to the present invention, it is possible to provide a compound applied to the photoelectric conversion element.

DESCRIPTION OF THE PREFERRED EMBODIMENTS

Hereinafter, preferred embodiments of a photoelectric conversion element of the present invention will be described.

In the present specification, a substituent for which whether it is substituted or unsubstituted is not specified may be further substituted with a substituent (preferably, a substituent W described below) within the scope not impairing an intended effect. For example, the expression of "alkyl group" corresponds to an alkyl group with which a substituent (preferably, a substituent W) may be substituted.

In addition, in the present specification, the numerical range represented by "to" means a range including numerical values denoted before and after "to" as a lower limit value and an upper limit value.

An example of a characteristic point of the present invention compared with the technique in the related art includes a point that a compound represented by Formula (1) (simply referred to as a "specific compound") described below is used. In this specific compound, a specific ring structure is introduced at a specific position, and as a result, characteristics of the photoelectric conversion element having a photoelectric conversion film including the specific compound (responsiveness and photoelectric conversion efficiency in a case of a thin film) are improved.

Although the detailed mechanism is unclear, it is assumed as follows. First, in the specific compound, the conjugated system is expanded by introducing a predetermined ring structure into the pyrromethene moiety. Also, since the specific compound has a three-dimensional structure and is excellent in charge transport characteristics, the specific compound has high responsiveness. Moreover, since the specific compound has a high light absorption coefficient (ε) and high internal quantum efficiency of the photoelectric conversion, it is considered that the photoelectric conversion efficiency in a case of a thin film is excellent.

Figure 1A:
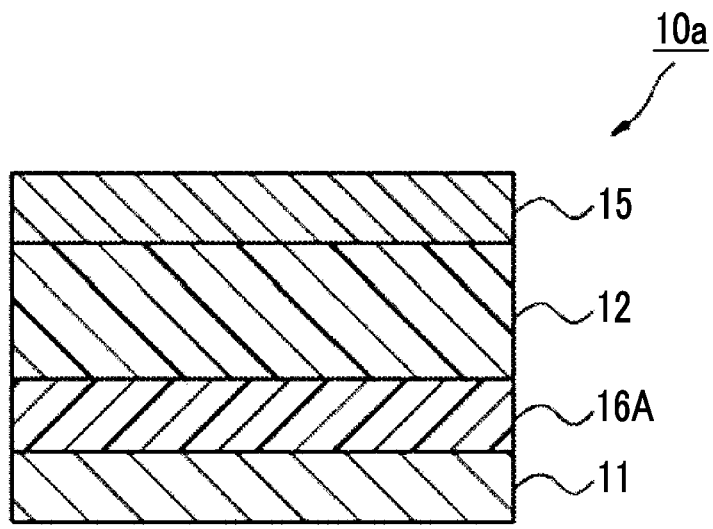
FIG. 1A is a schematic cross-sectional view showing an example of a configuration of a photoelectric conversion element.

Hereinafter, preferred embodiments of a photoelectric conversion element of the present invention will be described with reference to drawings. A schematic cross-sectional view of an embodiment of a photoelectric conversion element of the present invention is shown in FIGS. 1A and 1B.

A photoelectric conversion element 10a shown in FIG. 1A has a configuration in which a conductive film (hereinafter, also referred to as a lower electrode) 11 functioning as the lower electrode, an electron blocking film 16A, a photoelectric conversion film 12 containing the compound represented by Formula (1) described below, and a transparent conductive film (hereinafter, also referred to as an upper electrode) 15 functioning as the upper electrode are laminated in this order. FIG. 1B shows a configuration example of another photoelectric conversion element.

Figure 1B:
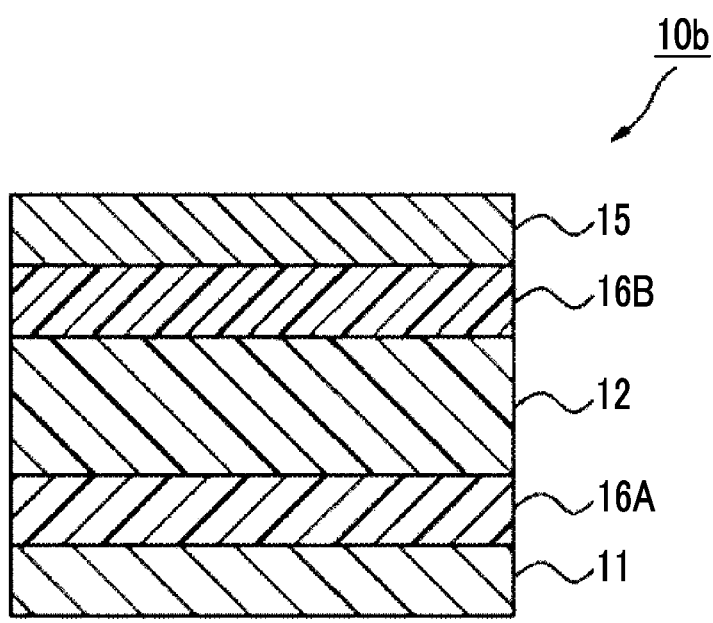
FIG. 1B is a schematic cross-sectional view showing an example of a configuration of a photoelectric conversion element.

A photoelectric conversion element 10b shown in FIG. 1B has a configuration in which the electron blocking film 16A, the photoelectric conversion film 12, a positive hole blocking film 16B, and the upper electrode 15 are laminated on the lower electrode 11 in this order. The lamination order of the electron blocking film 16A, the photoelectric conversion film 12, and the positive hole blocking film 16B in FIGS. 1A and 1B may be appropriately changed according to the application and the characteristics.

In the photoelectric conversion element 10a (or 10b), it is preferable that light is incident on the photoelectric conversion film 12 through the upper electrode 15.

Also, in a case where the photoelectric conversion element 10a (or 10b) is used, a voltage can be applied. In this case, the lower electrode 11 and the upper electrode 15 form a pair of electrodes, it is preferable that the voltage of $1 \times 10^{-5}$ to $1 \times 10^7$ V/cm is applied between the pair of electrodes. From the viewpoint of performance and power consumption, the voltage to be applied is more preferably $1 \times 10^{-4}$ to $1 \times 10^7$ V/cm, and still more preferably $1 \times 10^{-3}$ to $5 \times 10^6$ V/cm.

The voltage application method is preferable that the voltage is applied such that the electron blocking film 16A side is a cathode and the photoelectric conversion film 12 side is an anode, in FIGS. 1A and 1B. In a case where the photoelectric conversion element 10a (or 10b) is used as an optical sensor, or also in a case where the photoelectric conversion element 10a (or 10b) is incorporated in an imaging element, the voltage can be applied by the same method.

As described in detail below, the photoelectric conversion element 10a (or 10b) can be suitably applied to applications of the optical sensor and the imaging element.

Figure 2:
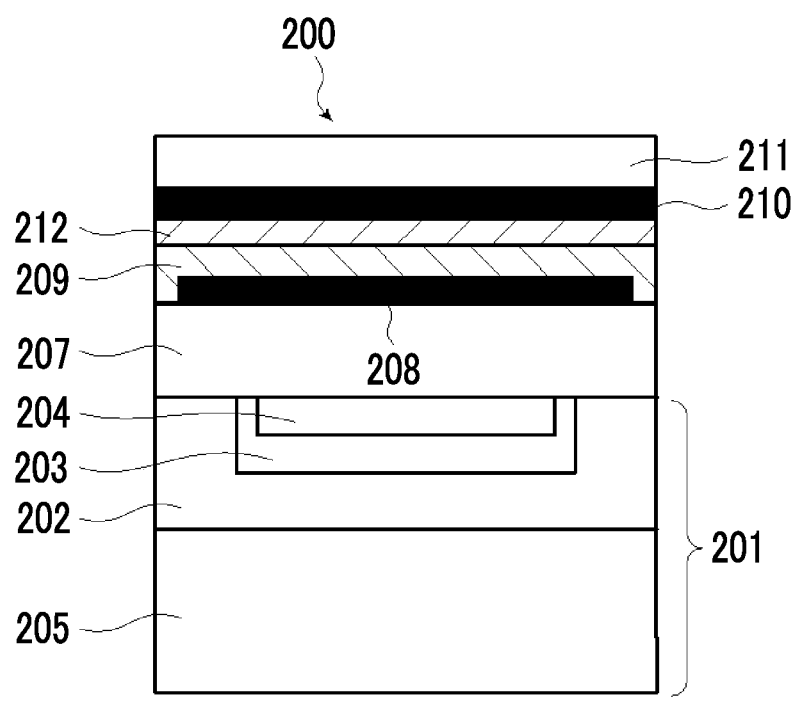
FIG. 2 is a schematic cross-sectional view of one pixel of a hybrid type photoelectric conversion element.

In addition, a schematic cross-sectional view of another embodiment of a photoelectric conversion element of the present invention is shown in FIG. 2.

The photoelectric conversion element 200 shown in FIG. 2 is a hybrid type photoelectric conversion element comprising an organic photoelectric conversion film 209 and an inorganic photoelectric conversion film 201. The organic photoelectric conversion film 209 contains the compound represented by Formula (1) described below.

The inorganic photoelectric conversion film 201 has an n-type well 202, a p-type well 203, and an n-type well 204 on a p-type silicon substrate 205.

Blue light is photoelectrically converted (B pixel) at a p-n junction formed between the p-type well 203 and the n-type well 204, and red light is photoelectrically converted (R pixel) at a p-n junction formed between the p-type well 203 and the n-type well 202. The conduction types of the n-type well 202, the p-type well 203, and the n-type well 204 are not limited thereto.

Furthermore, a transparent insulating layer 207 is disposed on the inorganic photoelectric conversion film 201.

A transparent pixel electrode 208 divided for each pixel is disposed on the insulating layer 207. The organic photoelectric conversion film 209 which absorbs green light and performs photoelectric conversion is disposed on the transparent pixel electrode in a single layer configuration commonly for each pixel. The electron blocking film 212 is disposed on the organic photoelectric conversion film in a single layer configuration commonly for each pixel. A transparent common electrode 210 with a single layer configuration is disposed on the electron blocking film. A transparent protective film 211 is disposed on the uppermost layer. The lamination order of the electron blocking film 212 and the organic photoelectric conversion film 209 may be reversed from that in FIG. 2, and the common electrode 210 may be disposed so as to be divided for each pixel.

The organic photoelectric conversion film 209 constitutes a G pixel for detecting green light.

The pixel electrode 208 is the same as the lower electrode 11 of the photoelectric conversion element 10a shown in FIG. 1A. The common electrode 210 is the same as the upper electrode 15 of the photoelectric conversion element 10a shown in FIG. 1A.

In a case where light from a subject is incident on the photoelectric conversion element 200, green light in the incident light is absorbed by the organic photoelectric conversion film 209 to generate optical charges. The optical charges flow into and accumulate in a green signal charge accumulation region not shown in the drawing from the pixel electrode 208.

Mixed light of the blue light and the red light transmitted through the organic photoelectric conversion film 209 enters the inorganic photoelectric conversion film 201. The blue light having a short wavelength is photoelectrically converted mainly at a shallow portion (in the vicinity of the p-n junction formed between the p-type well 203 and the n-type well 204) of a semiconductor substrate (the inorganic photoelectric conversion film) 201 to generate optical charges, and a signal is output to the outside. The red light having a long wavelength is photoelectrically converted mainly at a deep portion (in the vicinity of the p-n junction formed between the p-type well 203 and the n-type well 202) of the semiconductor substrate (the inorganic photoelectric conversion film) 201 to generate optical charges, and a signal is output to the outside.

In a case where the photoelectric conversion element 200 is used in the imaging element, a signal readout circuit (an electric charge transfer path in a case of a charge coupled device (CCD) type, or a metal-oxide-semiconductor (MOS) transistor circuit in a case of a complementary metal oxide semiconductor (CMOS) type), or the green signal charge accumulation region is formed in a surface portion of the p-type silicon substrate 205. In addition, the pixel electrode 208 is connected to the corresponding green signal charge accumulation region through vertical wiring.

Hereinafter, the form of each layer constituting the photoelectric conversion element of the present invention will be described in detail.

Photoelectric Conversion Film

Compound Represented by Formula (1)

The photoelectric conversion film 12 (or the organic photoelectric conversion film 209) is a film containing the compound represented by Formula (1) as a photoelectric conversion material. The photoelectric conversion element exhibiting excellent responsiveness, and excellent photoelectric conversion efficiency in a case of a thin film can be obtained by using the compound.

Hereinafter, the compound represented by Formula (1) will be described in detail. In Formula (2), * represents a binding site.

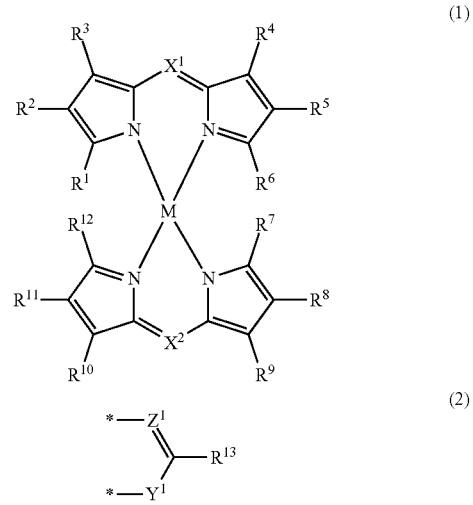

In Formula (1), $R^1$ to $R^{12}$ each independently represent a hydrogen atom or a substituent. The definition of the above-described substituent is synonymous with the substituent W described below.

Among these, from the viewpoint of obtaining superior responsiveness and/or the photoelectric conversion efficiency in a case of a thin film of the photoelectric conversion element (hereinafter, also simply referred to as the "viewpoint of obtaining a superior effect of the present invention"), $R^1$ to $R^{12}$ are preferably a hydrogen atom, an alkyl group, an aryl group, or a heteroaryl group.

In Formula (1), $X^1$ and $X^2$ each independently represent a nitrogen atom or $CR^{14}$. $R^{14}$ represents a hydrogen atom or a substituent. The definition of the above-described substituent is synonymous with the substituent W described below.

Among these, from the viewpoint of obtaining a superior effect of the present invention, $X^1$ and $X^2$ are preferably $CR^{14}$.

From the viewpoint of obtaining a superior effect of the present invention, $R^{14}$ is preferably a hydrogen atom, an alkyl group, an aryl group, or a heteroaryl group, and more preferably a hydrogen atom, an alkyl group, or an aryl group.

As described above, an alkyl group, an aryl group, or a heteroaryl group represented by $R^{14}$ may have a substituent. Examples of a substituent include the substituent W (for example, an alkyl group, or a halogen atom) described below.

In Formula (1), M represents a divalent metal atom. Examples of the divalent metal atom represented by M include Zn, Cu, Fe, Co, Ni, Au, Ag, Ir, Ru, Rh, Pd, Pt, Mn, Mg, Ti, Be, Ca, Ba, Cd, Hg, Pb, and Sn. Among these, the divalent metal atom represented by M is preferably Zn, Cu, Co, Ni, Pt, Pd, Mg, or Ca, and more preferably Zn.

In Formula (1), at least one set of $R^1$ and $R^2$, $R^5$ and $R^6$, $R^7$ and $R^8$, or $R^{11}$ and $R^{12}$ bonds to a structure represented by Formula (2) to form a ring.

For example, in a case where a set of $R^1$ and $R^2$ bonds to the structure represented by Formula (2) to form a ring, one of $R^1$ or $R^2$ is substituted with $Y^1$, and the other of $R^1$ or $R^2$ is substituted with $Z^1$. More specifically, in a case a set of $R^1$ and $R^2$ bonds to the structure represented by Formula (2) to form a ring, the obtained compounds are represented as follows.

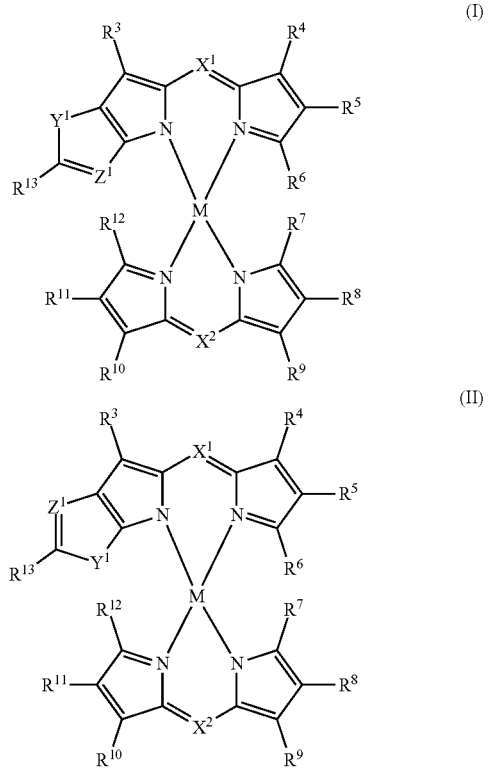

Among these, from the viewpoint of obtaining a superior effect of the present invention, it is preferable that at least one set of $R^1$ and $R^2$, or $R^5$ and $R^6$ bonds to the structure represented by Formula (2) to form a ring, and at least one set of $R^7$ and $R^8$, or $R^{11}$ and $R^{12}$ bonds to the structure represented by Formula (2) to form a ring.

In a case where the compound represented by Formula (1) has a plurality of structures each represented by Formula (2), a plurality of $Y^1$ may be different from each other, a plurality of $Z^1$ may be different from each other, and a plurality of $R^{13}$ may be different from each other.

$R^2$ and $R^3$ do not bond to each other to form a ring. $R^4$ and $R^5$ do not bond to each other to form a ring. $R^8$ and $R^9$ do not bond to each other to form a ring. $R^{10}$ and $R^{11}$ do not bond to each other to form a ring.

In Formula (2), $Y^1$ represents an oxygen atom, a sulfur atom, a selenium atom, $NR^{15}$, $CR^{16}R^{17}$, or $-CR^{18}=CR^{19}-$. Among these, from the viewpoint of obtaining a superior effect of the present invention, $Y^1$ is preferably an oxygen atom or a sulfur atom.

$R^{15}$ to $R^{19}$ each independently represent a hydrogen atom or a substituent. The definition of the above-described substituent is synonymous with the substituent W described below. Among these, from the viewpoint of obtaining a superior effect of the present invention, $R^{15}$ to $R^{19}$ are preferably a hydrogen atom, an alkyl group, an aryl group, or a heteroaryl group, and more preferably a hydrogen atom.

In Formula (2), $Z^1$ represents a nitrogen atom or $CR^{20}$. Among these, from the viewpoint of obtaining a superior effect of the present invention, $Z^1$ is preferably $CR^{20}$.

$R^{20}$ represents a hydrogen atom or a substituent. The definition of the above-described substituent is synonymous with the substituent W described below. Among these, from the viewpoint of obtaining a superior effect of the present invention, $R^{20}$ is preferably a hydrogen atom, an alkyl group, an aryl group, or a heteroaryl group, and more preferably a hydrogen atom.

In Formula (2), $R^{13}$ represents a hydrogen atom or a substituent. The definition of the above-described substituent is synonymous with the substituent W described below. Among these, from the viewpoint of obtaining a superior effect of the present invention, $R^{13}$ is preferably a hydrogen atom, a halogen atom, an alkoxy group (particularly, a methoxy group), an alkyl group, an aryl group, or a heteroaryl group, and more preferably an alkyl group, or an aryl group.

In Formula (2), in a case where $Z^1$ represents $CR^{20}$, $R^{20}$ and $R^{13}$ may bond to each other to form a ring. The formed ring may be an aromatic ring, or a non-aromatic ring, and is preferably an aromatic ring. In a case where the formed ring is the aromatic ring, the formed ring may be an aromatic hydrocarbon ring or an aromatic heterocycle. The formed ring may be a monocycle, or a condensed ring having two or more rings. Also, the formed ring may be substituted with a substituent (preferably, the substituent W described below).

A molecular weight of the compound represented by Formula (1) is not particularly limited, but is preferably 400 to 1200. In a case where the molecular weight is 1200 or less, the vapor deposition temperature does not increase, and the decomposition of the compound hardly occurs. In a case where the molecular weight is 400 or more, a glass transition point of a deposited film does not decrease, and a heat resistance of the photoelectric conversion element is improved.

From the viewpoint of obtaining a superior effect of the present invention, the compound represented by Formula (1) is preferably a compound represented by any of Formulae (3) to (6).

The compound represented by Formula (3) and the compound represented by Formula (4) correspond to the compound represented by Formula (1) having two structures each represented by Formula (2), and the compound represented by Formula (5) and the compound represented by Formula (6) correspond to the compound represented by Formula (1) having the four structures each represented by Formula (2).

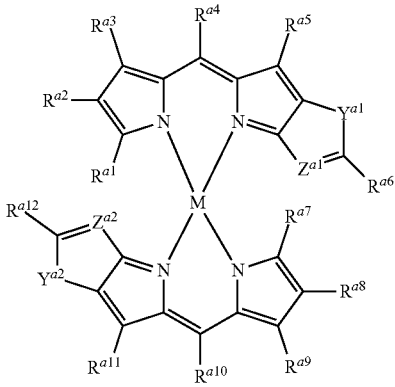

(3)

(4)

(5)

(6)

In Formulae (3) to (6), $R^{a1}$ to $R^{a12}$, $R^{b1}$ to $R^{b12}$, $R^{c1}$ to $R^{c10}$, and $R^{d1}$ to $R^{d10}$ each independently represent a hydrogen atom, an alkyl group, an aryl group, or a heteroaryl group.

Among these, from the viewpoint of obtaining a superior effect of the present invention, $R^{a4}$ and $R^{a10}$ in Formula (3), $R^{b4}$ and $R^{b10}$ in Formula (4), $R^{c3}$ and $R^{c8}$ in Formula (5), and $R^{d3}$ and $R^{d8}$ in Formula (6) are each independently preferably a hydrogen atom, an alkyl group, or an aryl group.

An alkyl group, an aryl group, and a heteroaryl group represented by $R^{a4}$ and $R^{a10}$ in Formula (3), $R^{b4}$ and $R^{b10}$ in Formula (4), $R^{c3}$ and $R^{c8}$ in Formula (5), and $R^{d3}$ and $R^{d8}$ in Formula (6) as described above may have a substituent. Examples of a substituent include the substituent W (for example, an alkyl group, or a halogen atom) described below.

In Formula (3), from the viewpoint of obtaining a superior effect of the present invention, $R^{a2}$ and $R^{a8}$ are preferably a hydrogen atom, an alkyl group, or an aryl group, and more preferably a hydrogen atom.

From the viewpoint of obtaining a superior effect of the present invention, $R^{a5}$ and $R^{a11}$ are preferably a hydrogen atom, an alkyl group, or an aryl group, more preferably a hydrogen atom, or an alkyl group, and still more preferably a hydrogen atom.

From the viewpoint of obtaining a superior effect of the present invention, $R^{a1}$, $R^{a3}$, $R^{a6}$, $R^{a7}$, $R^{a9}$, and $R^{a12}$ are preferably a hydrogen atom, an alkyl group, an aryl group, or a heteroaryl group, and more preferably an alkyl group, or an aryl group.

In Formula (4), from the viewpoint of obtaining a superior effect of the present invention, $R^{b2}$ and $R^{b8}$ are preferably a hydrogen atom, an alkyl group, or an aryl group, and more preferably a hydrogen atom.

From the viewpoint of obtaining a superior effect of the present invention, $R^{b5}$ and $R^{b11}$ are preferably a hydrogen atom, an alkyl group, or an aryl group, more preferably a hydrogen atom, or an alkyl group, and still more preferably a hydrogen atom.

From the viewpoint of obtaining a superior effect of the present invention, $R^{b1}$, $R^{b3}$, $R^{b6}$, $R^{b7}$, $R^{b9}$, and $R^{b12}$ are preferably a hydrogen atom, an alkyl group, an aryl group, or a heteroaryl group, and more preferably an alkyl group, or an aryl group.

In Formula (5), from the viewpoint of obtaining a superior effect of the present invention, $R^{c2}$, $R^{c4}$, $R^{c7}$, and $R^{c9}$ are preferably a hydrogen atom, an alkyl group, or an aryl group, more preferably a hydrogen atom, or an alkyl group, and still more preferably a hydrogen atom.

From the viewpoint of obtaining a superior effect of the present invention, $R^{c1}$, $R^{c5}$, $R^{c6}$, and $R^{c10}$ are preferably a hydrogen atom, an alkyl group, an aryl group, or a heteroaryl group, and more preferably an alkyl group.

In Formula (6), from the viewpoint of obtaining a superior effect of the present invention, $R^{d2}$, $R^{d4}$, $R^{d7}$, and $R^{d9}$ are preferably a hydrogen atom, an alkyl group, or an aryl group, more preferably a hydrogen atom, or an alkyl group, and still more preferably a hydrogen atom.

From the viewpoint of obtaining a superior effect of the present invention, $R^{d1}$, $R^{d5}$, $R^{d6}$, and $R^{d10}$ are preferably a hydrogen atom, an alkyl group, an aryl group, or a heteroaryl group, and more preferably an alkyl group.

M in Formulae (3) to (6) represents Zn, Cu, Co, Ni, Pt, Pd, Mg, or Ca. Among these, from the viewpoint of obtaining a superior effect of the present invention, M is preferably Zn.

$Y^{a1}$, $Y^{a2}$, $Y^{b1}$, $Y^{b2}$, $Y^{c1}$, $Y^{c2}$, $Y^{c3}$, $Y^{c4}$, $Y^{d1}$, $Y^{d2}$, $Y^{d3}$, and $Y^{d4}$ each independently represent an oxygen atom, a sulfur atom, a selenium atom, $NR^{21}$, $CR^{22}R^{23}$, or $-CR^{24}=CR^{25}-$. Among these, from the viewpoint of obtaining a superior effect of the present invention, $Y^{a1}$, $Y^{a2}$, $Y^{b1}$, $Y^{b2}$, $Y^{c1}$, $Y^{c2}$, $Y^{c3}$, $Y^{c4}$, $Y^{d1}$, $Y^{d2}$, $Y^{d3}$, and $Y^{d4}$ each independently represent preferably an oxygen atom or a sulfur atom.

$R^{21}$ to $R^{25}$ each independently represent a hydrogen atom, an alkyl group, an aryl group, or a heteroaryl group. Among these, from the viewpoint of obtaining a superior effect of the present invention, $R^{21}$ to $R^{25}$ are more preferably a hydrogen atom.

$Z^{a1}$, $Z^{a2}$, $Z^{b1}$, $Z^{b2}$, $Z^{c1}$, $Z^{c2}$, $Z^{c3}$, $Z^{c4}$, $Z^{d1}$, $Z^{d2}$, $Z^{d3}$, and $Z^{d4}$ each independently represent a nitrogen atom or $CR^{26}$. Among these, from the viewpoint of obtaining a superior effect of the present invention, $Z^{a1}$, $Z^{a2}$, $Z^{b1}$, $Z^{b2}$, $Z^{c1}$, $A^{c2}$, $Z^{c3}$, $Z^{c4}$, $Z^{d1}$, $Z^{d2}$, $Z^{d3}$, and $Z^{d4}$ are preferably $CR^{26}$.

$R^{26}$ represents a hydrogen atom, an alkyl group, an aryl group, or a heteroaryl group. Among these, from the viewpoint of obtaining a superior effect of the present invention, $R^{26}$ is preferably a hydrogen atom, or an alkyl group, and more preferably a hydrogen atom.

In a case where $Z^{a1}$ represents $CR^{26}$, $R^{26}$ and $R^{a6}$ may bond to each other to form a ring. In a case where $Z^{a2}$ represents $CR^{26}$, $R^{26}$ and $R^{a12}$ may bond to each other to form a ring. In a case where $Z^{b1}$ represents $CR^{26}$, $R^{26}$ and $R^{b6}$ may bond to each other to form a ring. In a case where $Z^{b2}$ represents $CR^{26}$, $R^{26}$ and $R^{b12}$ may bond to each other to form a ring. In a case where $Z^{c1}$ represents $CR^{26}$, $R^{26}$ and $R^{c1}$ may bond to each other to form a ring. In a case where $Z^{c2}$ represents $CR^{26}$, $R^{26}$ and $R^{c5}$ may bond to each other to form a ring. In a case where $Z^{c3}$ represents $CR^{26}$, $R^{26}$ and $R^{c6}$ may bond to each other to form a ring. In a case where $Z^{c4}$ represents $CR^{26}$, $R^{26}$ and $R^{c10}$ may bond to each other to form a ring. In a case where $Z^{d1}$ represents $CR^{26}$, $R^{26}$ and $R^{d1}$ may bond to each other to form a ring. In a case where $Z^{d2}$ represents $CR^{26}$, $R^{26}$ and $R^{d5}$ may bond to each other to form a ring. In a case where $Z^{d3}$ represents $CR^{26}$, $R^{26}$ and $R^{d6}$ may bond to each other to form a ring. In a case where $Z^{d4}$ represents $CR^{26}$, $R^{26}$ and $R^{d10}$ may bond to each other to form a ring.

The ring formed as described above may be an aromatic ring, or a non-aromatic ring, and is preferably an aromatic ring. In a case where the formed ring is the aromatic ring, the formed ring may be an aromatic hydrocarbon ring or an aromatic heterocycle. The formed ring may be a monocycle, or a condensed ring having two or more rings. The formed ring may be substituted with a substituent (preferably, the substituent W described below).

The molecular weight of the compound represented by Formula (3) or (4) is not particularly limited, but is preferably 1200 or less.

In a case where the molecular weight is 1200 or less, the vapor deposition temperature does not increase, and the decomposition of the compound hardly occurs. The lower limit of the molecular weight is not particularly limited, but is preferably 400 or more. In a case where the molecular weight is 400 or more, a glass transition point of a deposited film does not decrease, and a heat resistance of the photoelectric conversion element is improved.

The molecular weight of the compound represented by Formula (5) or (6) is not particularly limited, but is preferably 1200 or less. In a case where the molecular weight is 1200 or less, the vapor deposition temperature does not increase, and the decomposition of the compound hardly occurs. The lower limit of the molecular weight is not particularly limited, but is preferably 500 or more. In a case where the molecular weight is 500 or more, a glass transition point of a deposited film does not decrease, and a heat resistance of the photoelectric conversion element is improved.

From the viewpoint of obtaining a superior effect of the present invention, the compound represented by any of Formulae (3) to (6) is preferably a compound represented by any of Formulae (7) to (10).

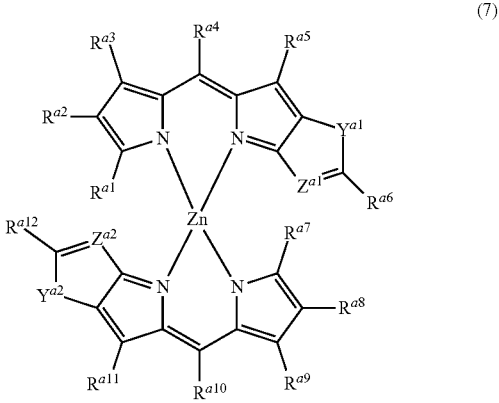

(7)

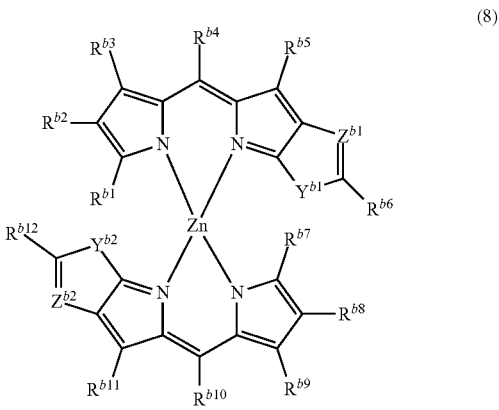

(8)

-continued

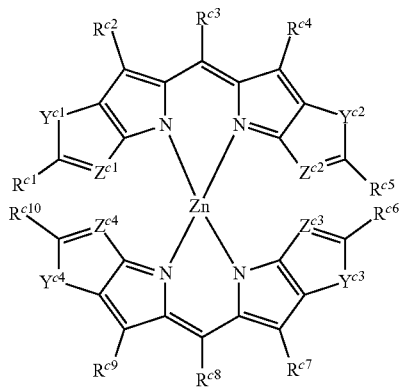

(9)

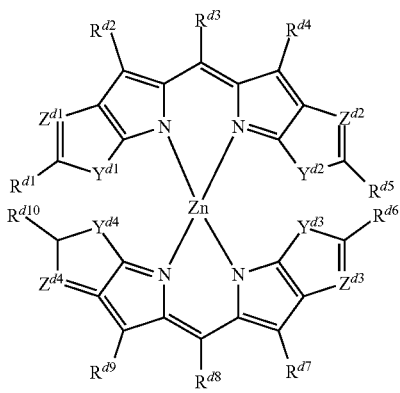

(10)

In Formulae (7) to (10), $R^{a1}$ to $R^{a12}$, $R^{b1}$ to $R^{b12}$, $R^{c1}$ to $R^{c10}$, and $R^{d1}$ to $R^{d10}$ each independently represent a hydrogen atom, an alkyl group, an aryl group, or a heteroaryl group. $Y^{a1}$, $Y^{a2}$, $Y^{b1}$, $Y^{b2}$, $Y^{c1}$, $Y^{c2}$, $Y^{c3}$, $Y^{c4}$, $Y^{d1}$, $Y^{d2}$, $Y^{d3}$, and $Y^{d4}$ each independently represent an oxygen atom, a sulfur atom, a selenium atom, $NR^{21}$, $CR^{22}R^{23}$, or —$CR^{24}$=$CR^{25}$—. $Z^{a1}$, $Z^{a2}$, $Z^{b1}$, $Z^{b2}$, $Z^{c1}$, $Z^{c2}$, $Z^{c3}$, $Z^{c4}$, $Z^{d1}$, $Z^{d2}$, $Z^{d3}$, and $Z^{d4}$ each independently represent a nitrogen atom or $CR^{26}$. $R^{21}$ to $R^{26}$ each independently represent a hydrogen atom, an alkyl group, an aryl group, or a heteroaryl group. In a case where $Z^{a1}$ represents $CR^{26}$, $R^{26}$ and $R^{a6}$ may bond to each other to form a ring. In a case where $Z^{a2}$ represents $CR^{26}$, $R^{26}$ and $R^{a12}$ may bond to each other to form a ring. In a case where $Z^{b1}$ represents $CR^{26}$, $R^{26}$ and $R^{b6}$ may bond to each other to form a ring. In a case where $Z^{b2}$ represents $CR^{26}$, $R^{26}$ and $R^{b12}$ may bond to each other to form a ring. In a case where $Z^{c1}$ represents $CR^{26}$, $R^{26}$ and $R^{c1}$ may bond to each other to form a ring. In a case where $Z^{c2}$ represents $CR^{26}$, $R^{26}$ and $R^{c5}$ may bond to each other to form a ring. In a case where $Z^{c3}$ represents $CR^{26}$, $R^{26}$ and $R^{c6}$ may bond to each other to form a ring. In a case where $Z^{c4}$ represents $CR^{26}$, $R^{26}$ and $R^{c10}$ may bond to each other to form a ring. In a case where $Z^{d1}$ represents $CR^{26}$, $R^{26}$ and $R^{d1}$ may bond to each other to form a ring. In a case where $Z^{d2}$ represents $CR^{26}$, $R^{26}$ and $R^{d5}$ may bond to each other to form a ring. In a case where $Z^{d3}$ represents $CR^{26}$, $R^{26}$ and $R^{d6}$ may bond to each other to form a ring. In a case where $Z^{d4}$ represents $CR^{26}$, $R^{26}$ and $R^{d10}$ may bond to each other to form a ring.

Formula (7) corresponds to a case where M represents Zn in Formula (3). Similarly, Formula (8) corresponds to a case where M represents Zn in Formula (4). Formula (9) corresponds to a case where M represents Zn in Formula (5). Formula (10) corresponds to a case where M represents Zn in Formula (6).

The preferred range of each substituent is the same as described above.

The substituent W in the present specification will be described below.

Examples of the substituent W include a halogen atom (a fluorine atom, a chlorine atom, a bromine atom, and an iodine atom, and the like), an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group, a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonium group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocyclic azo group, an imide group, a phosphino group, a phosphinyl group, a phosphinyloxy group, a phosphinylamino group, a phosphono group, a silyl group, a hydrazino group, a ureido group, a boronic acid group (—$B(OH)_2$), a phosphato group (—$OPO(OH)_2$), a sulfato group (—$OSO_3H$), and other well-known substituents.

Also, the substituent W may be further substituted with the substituent W. For example, an alkyl group may be substituted with a halogen atom.

The details of the substituent W are disclosed in paragraph [0023] of JP2007-234651A.

An alkyl group of the specific compound (the compound represented by Formula (1), and the compound represented by Formulae (3) to (6)) preferably has 1 to 10 carbon atoms, more preferably has 1 to 6 carbon atoms, and still more preferably has 1 to 4 carbon atoms. The alkyl group may be any of linear, branched, or cyclic. Also, the alkyl group may be substituted with a substituent (preferably, the substituent W).

Examples of the alkyl group include a methyl group, an ethyl group, an n-propyl group, an i-propyl group, an n-butyl group, a t-butyl group, an n-hexyl group, and a cyclohexyl group.

The number of carbon atoms in the aryl group of the specific compound (the compound represented by Formula (1), and the compound represented by Formulae (3) to (6)) is not particularly limited, but is preferably 6 to 30 carbon atoms, more preferably 6 to 18 carbon atoms, and still more preferably 6 carbon atoms from the viewpoint of obtaining a superior effect of the present invention. The aryl group may have a monocyclic structure or a condensed ring structure (a fused ring structure) in which two or more rings are condensed. Also, the aryl group may be substituted with a substituent (preferably, the substituent W).

Examples of the aryl group include a phenyl group, a naphthyl group, an anthryl group, a pyrenyl group, a phenanthrenyl group, a methylphenyl group, a dimethylphenyl group, a biphenyl group, and a fluorenyl group, and a phenyl group, a naphthyl group, or an anthryl group is preferable.

The number of carbon atoms in the heteroaryl group (a monovalent aromatic heterocyclic group) of the specific compound (the compound represented by Formula (1), and the compound represented by Formulae (3) to (6)) is not particularly limited, but is preferably 3 to 30, and more preferably 3 to 18 from the viewpoint of obtaining a superior effect of the present invention. Also, the heteroaryl group may be substituted with a substituent (preferably, the substituent W).

The heteroaryl group includes a hetero atom in addition to a carbon atom and a hydrogen atom. Examples of the hetero atom include a nitrogen atom, a sulfur atom, an oxygen atom, a selenium atom, a tellurium atom, a phosphorus atom, a silicon atom, and a boron atom, and a nitrogen atom, a sulfur atom, or an oxygen atom is preferable.

The number of hetero atoms contained in the heteroaryl group is not particularly limited, but is usually about 1 to 10, preferably 1 to 4, and more preferably 1 to 2.

The number of ring members of the heteroaryl group is not particularly limited, but is preferably 3 to 8, more preferably 5 to 7, and still more preferably 5 to 6. The heteroaryl group may have a monocyclic structure or a condensed ring structure in which two or more rings are condensed. In a case of the condensed ring structure, an aromatic hydrocarbon ring having no hetero atom (for example, a benzene ring) may be included.

Examples of the heteroaryl group include a pyridyl group, a quinolyl group, an isoquinolyl group, an acridinyl group, a phenanthridinyl group, a pteridinyl group, a pyrazinyl group, a quinoxalinyl group, a pyrimidinyl group, a quinazolyl group, a pyridazinyl group, a cinnolinyl group, a phthalazinyl group, a triazinyl group, an oxazolyl group, a benzoxazolyl group, a thiazolyl group, a benzothiazolyl group, an imidazolyl group, a benzimidazolyl group, a pyrazolyl group, an indazolyl group, an isoxazolyl group, a benzisoxazolyl group, an isothiazolyl group, a benzisothiazolyl group, an oxadiazolyl group, a thiadiazolyl group, a triazolyl group, a tetrazolyl group, a furyl group, a benzofuryl group, a thienyl group, a benzothienyl group, a dibenzofuryl group, a dibenzothienyl group, a pyrrolyl group, an indolyl group, an imidazopyridinyl group, and a carbazolyl group.

Hereinafter, the compound represented by Formula (1) will be exemplified.

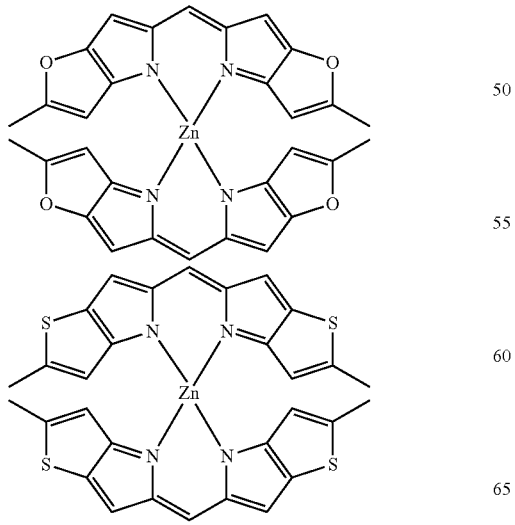

-continued

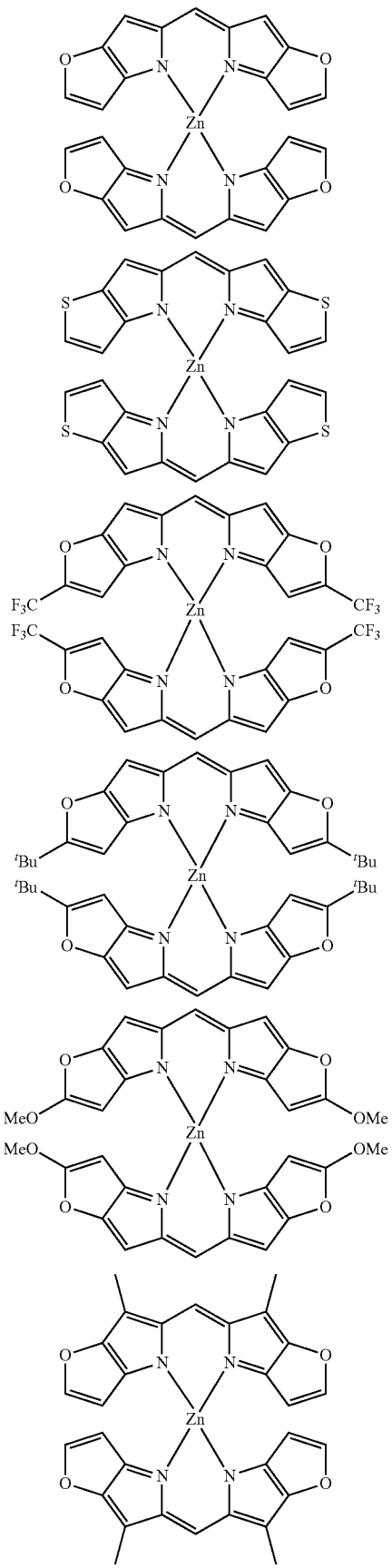

-continued
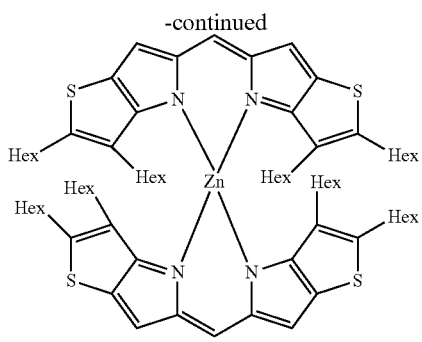
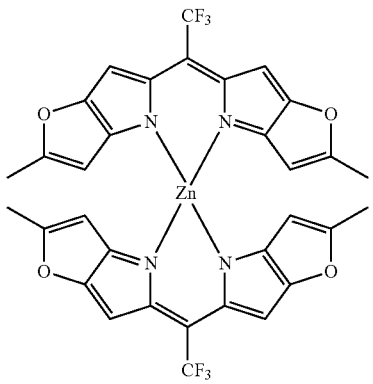
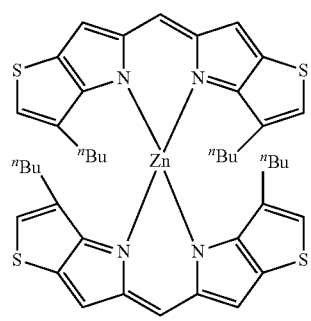
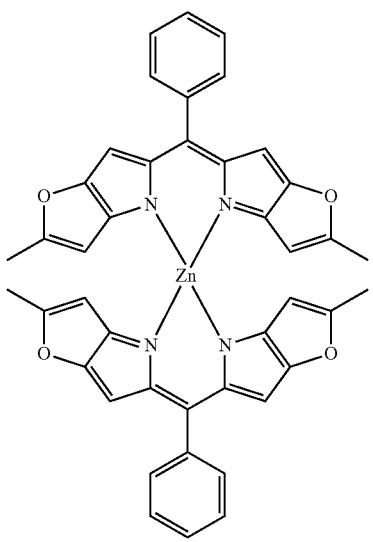
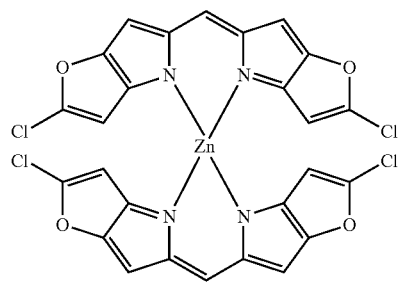
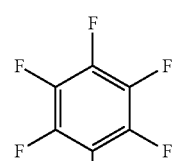
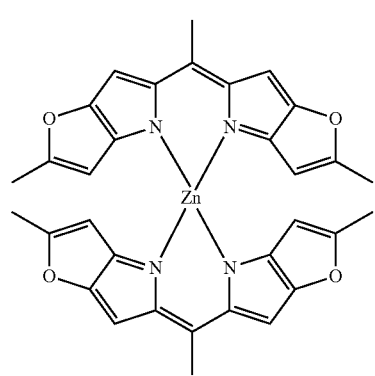
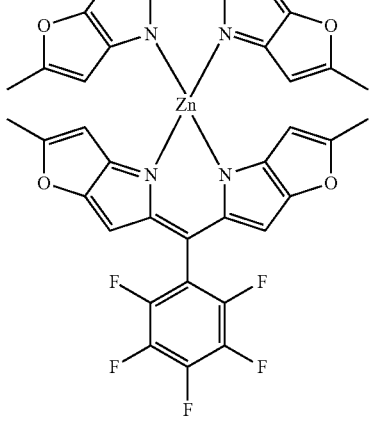

19
-continued
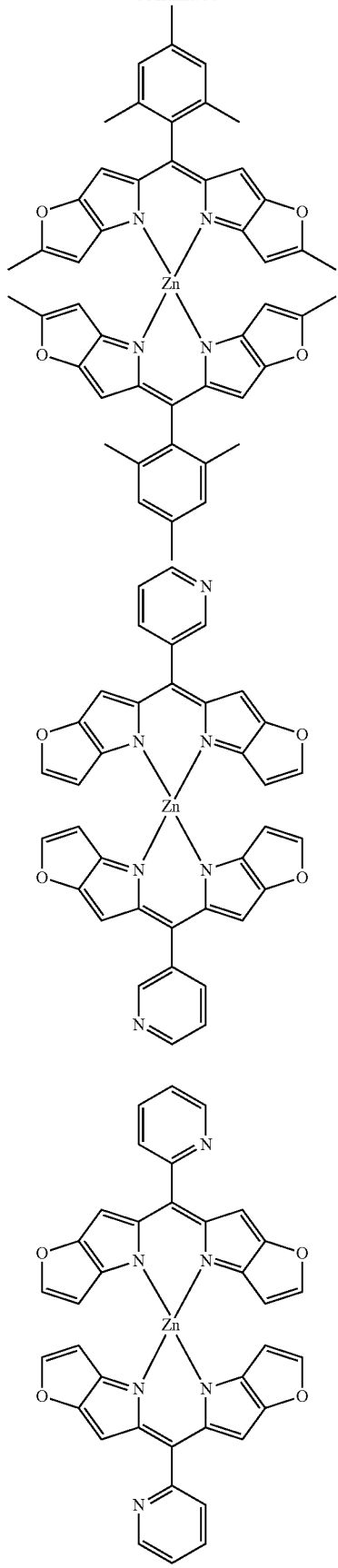
20
-continued
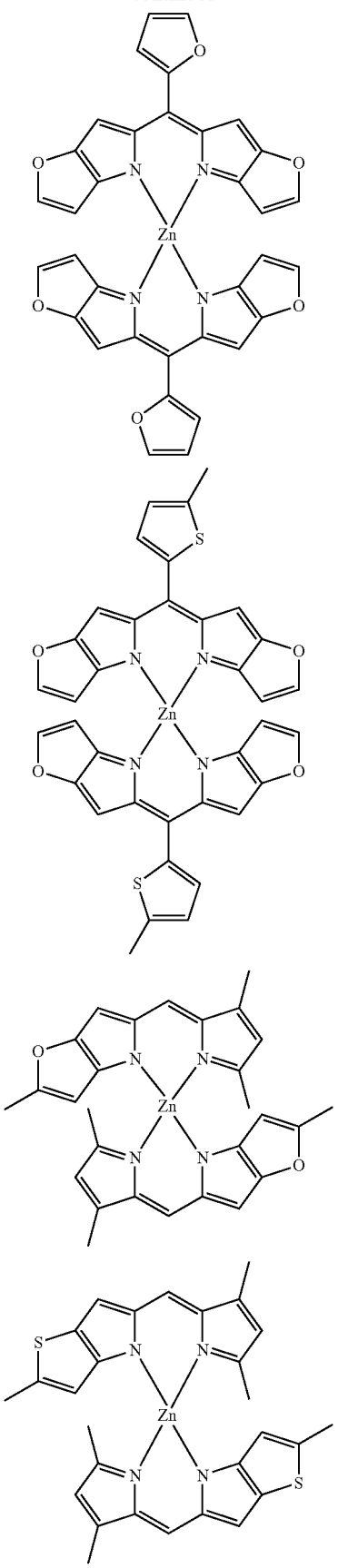

-continued
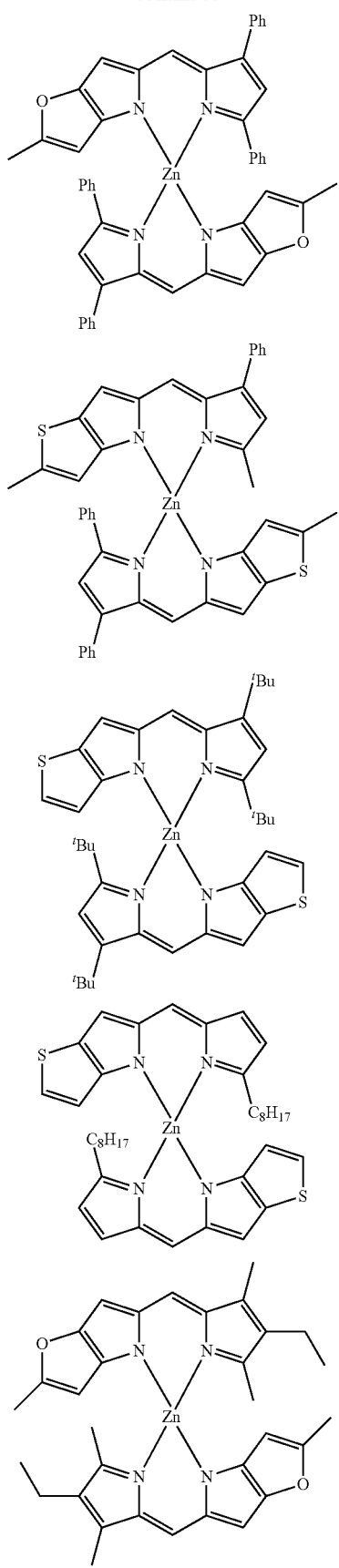
-continued
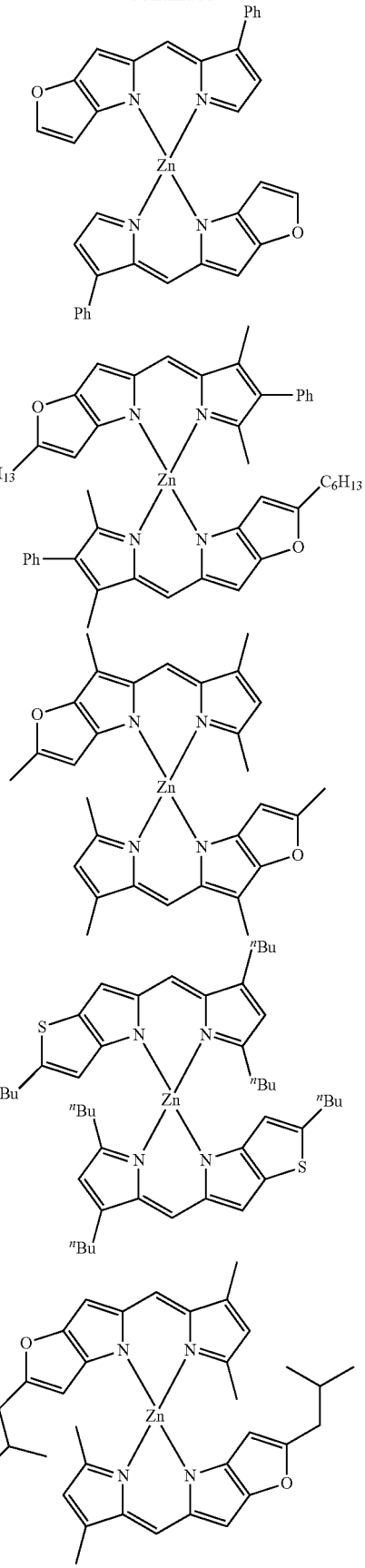

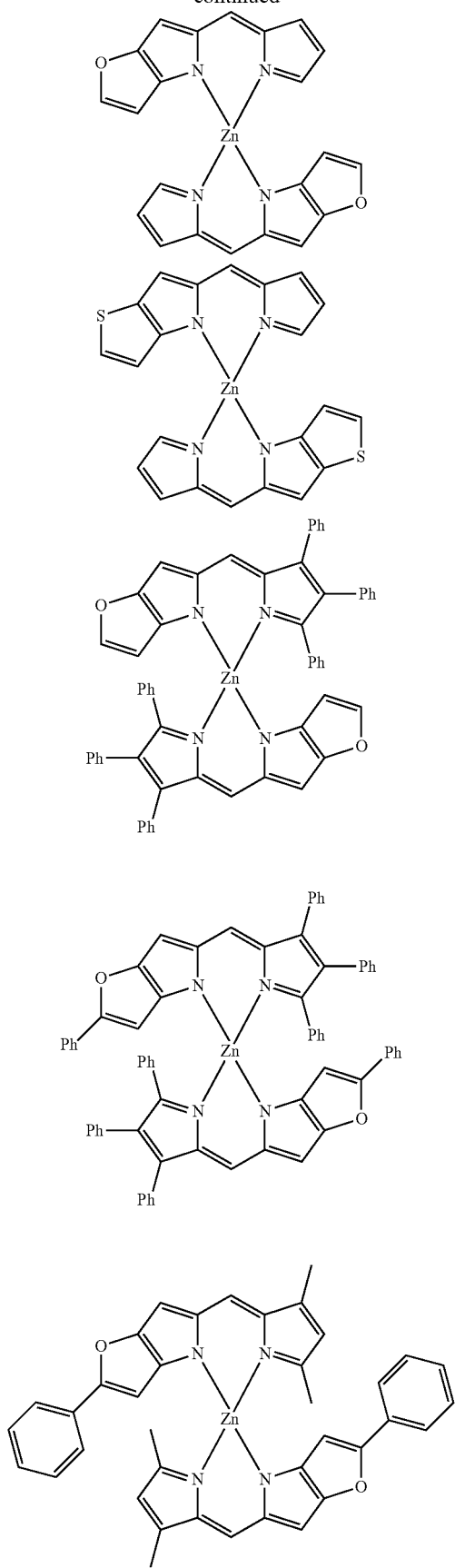
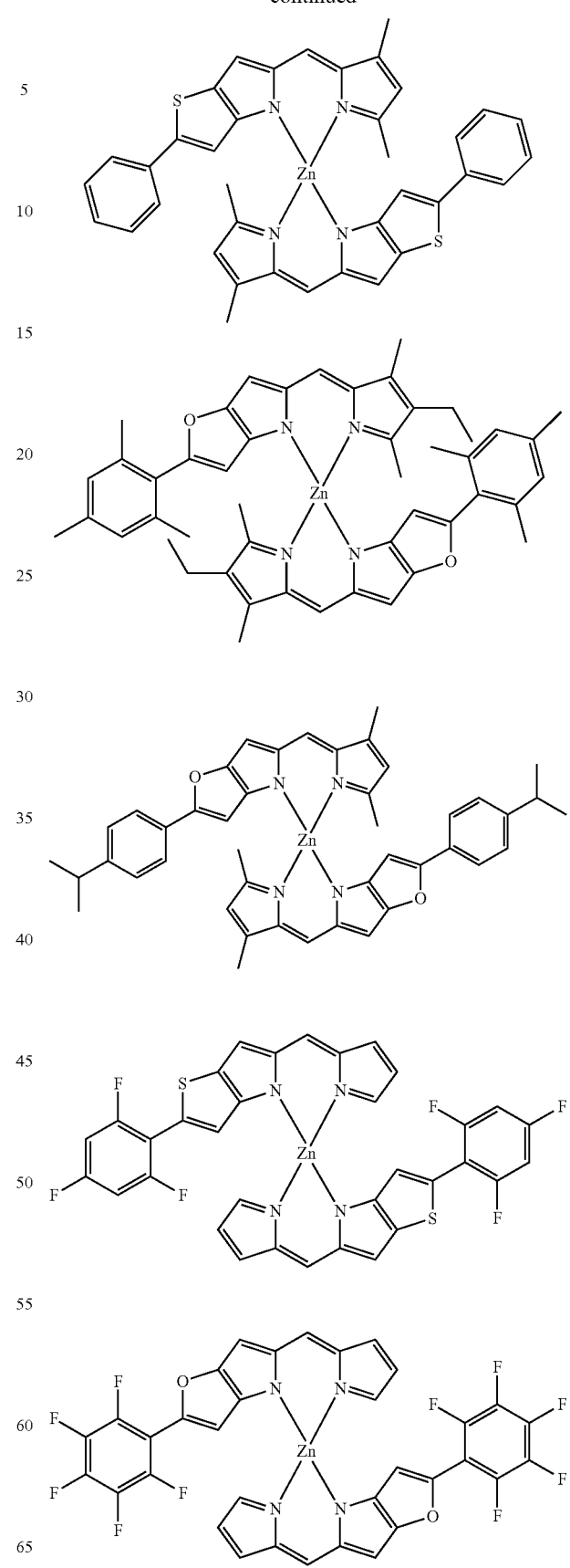

25
-continued
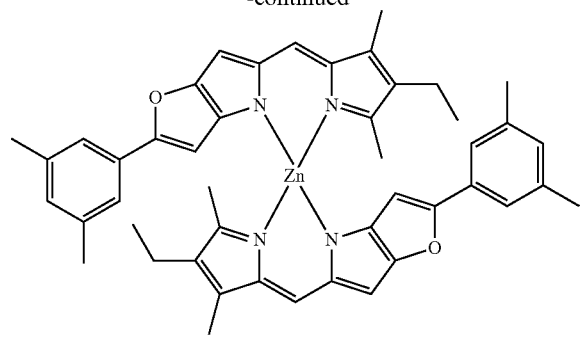
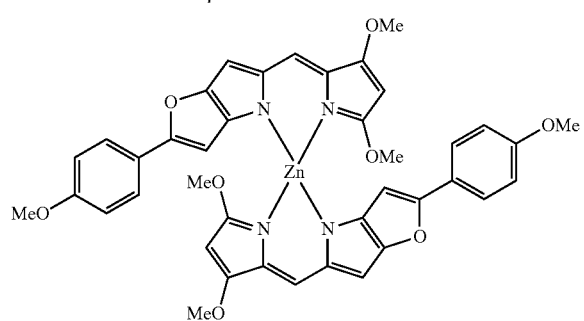
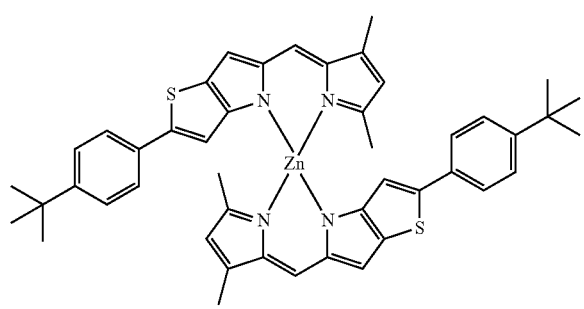
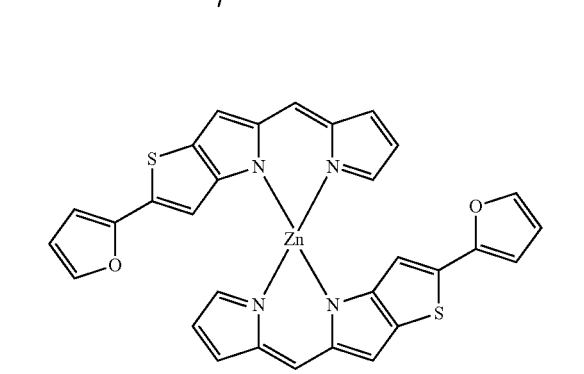
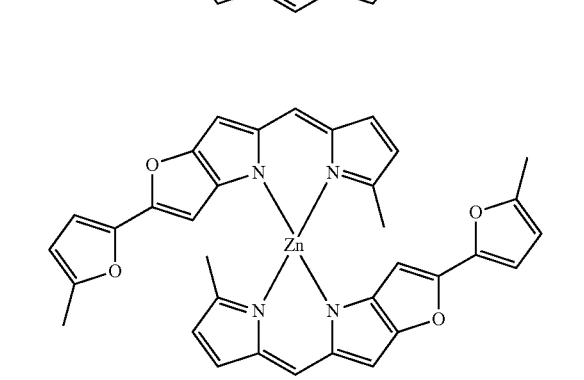
26
-continued
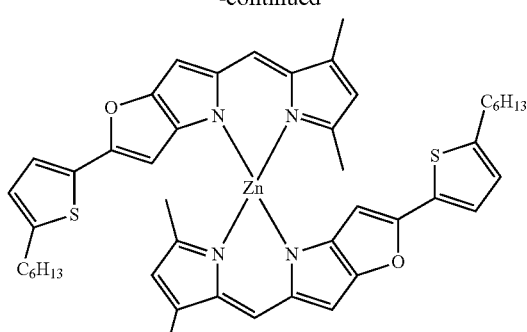
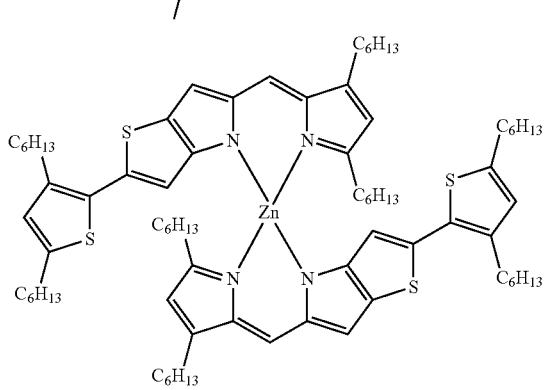
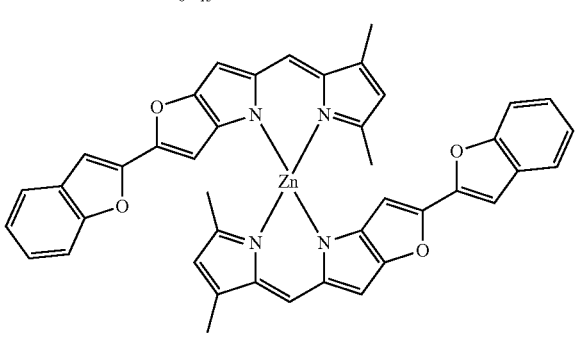
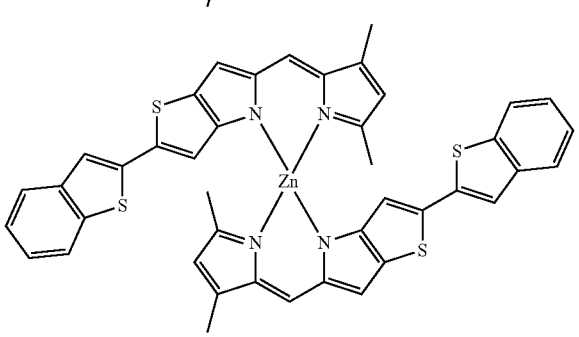
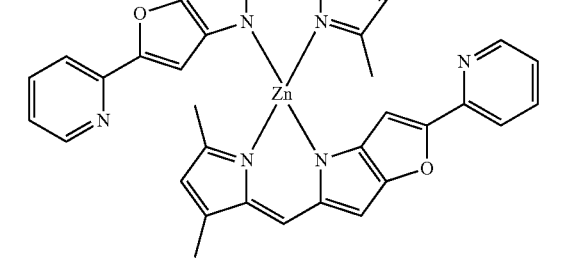

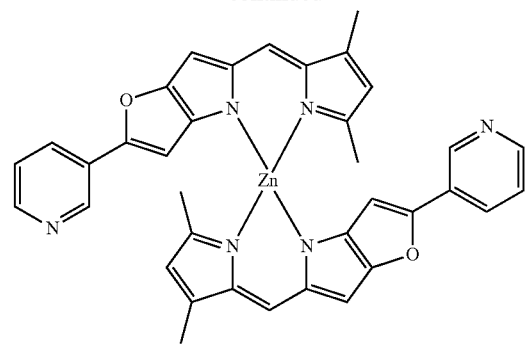
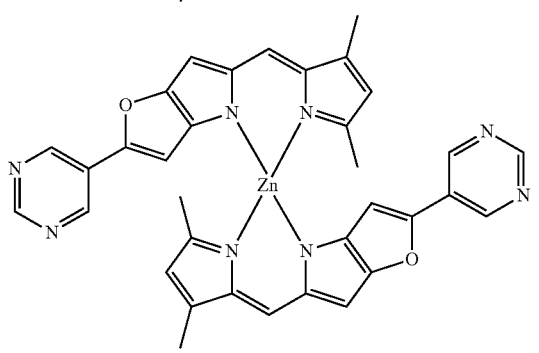
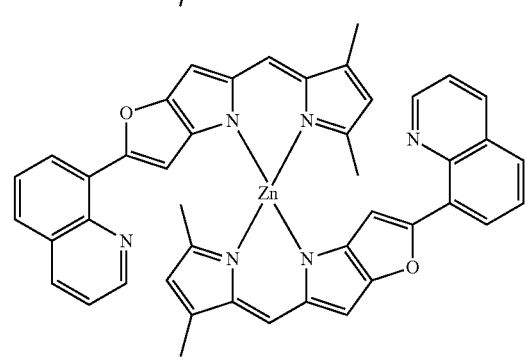
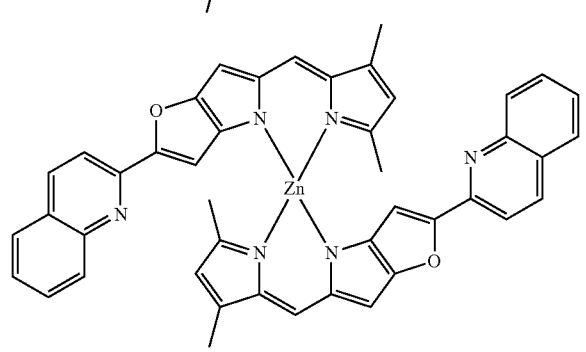
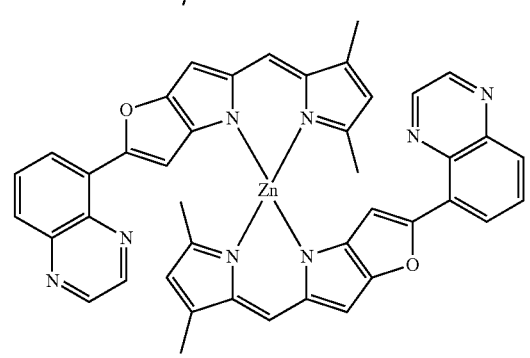
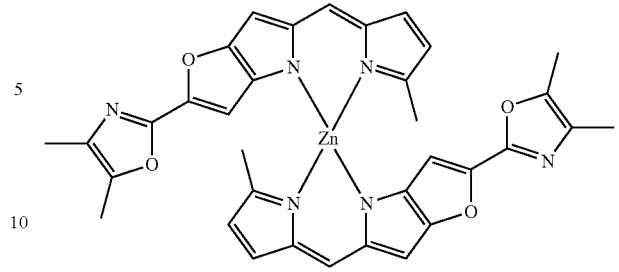
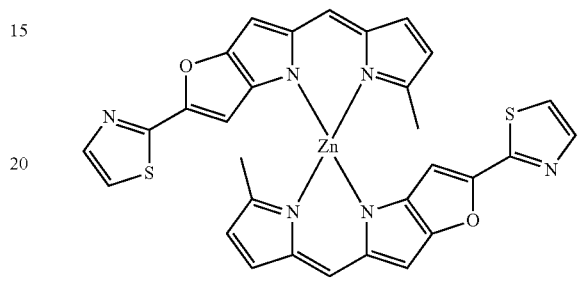
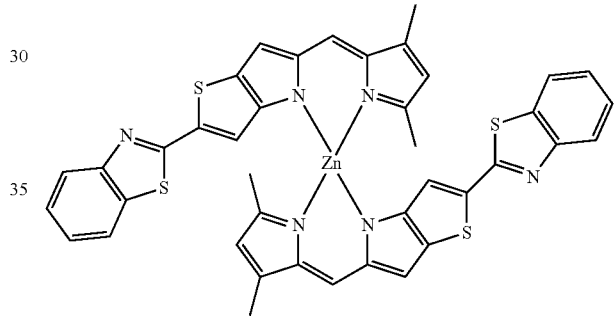
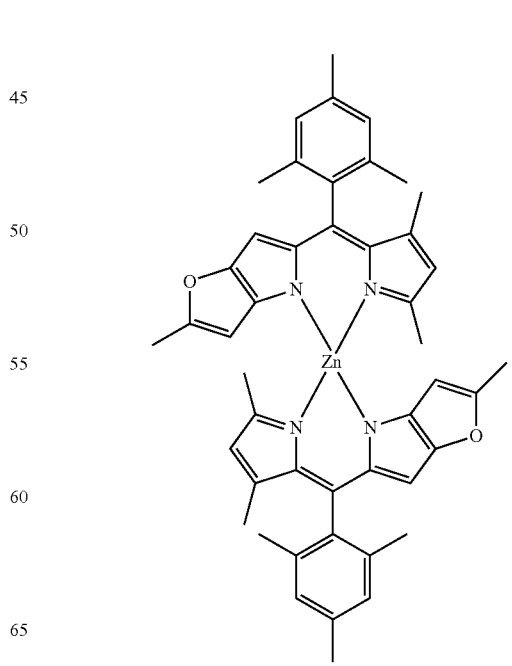

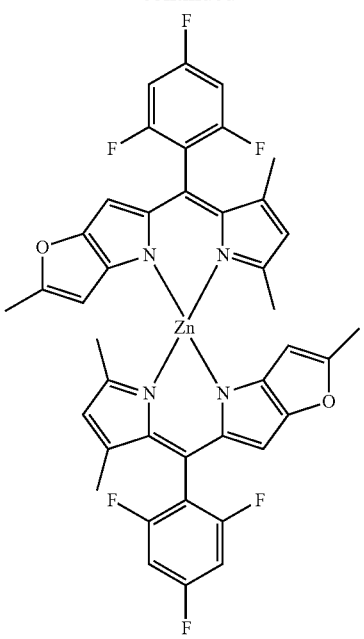
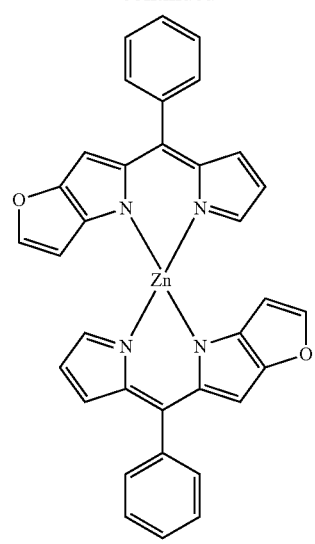
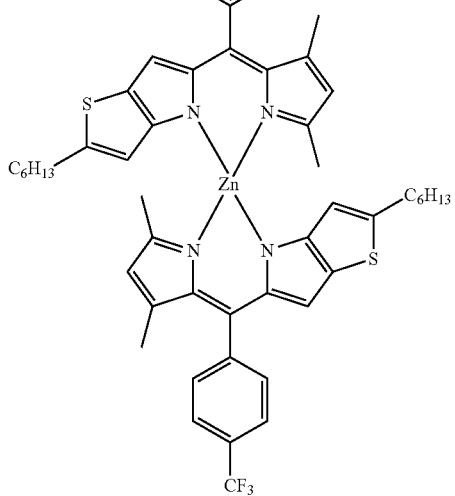
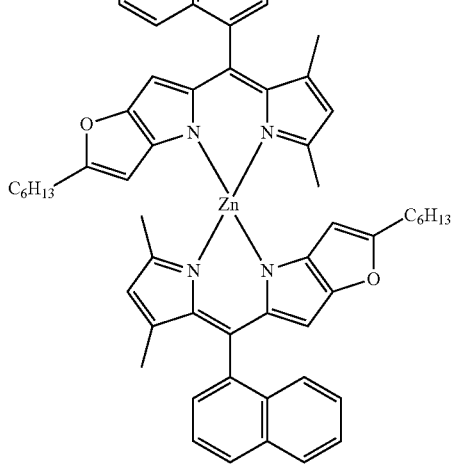

-continued
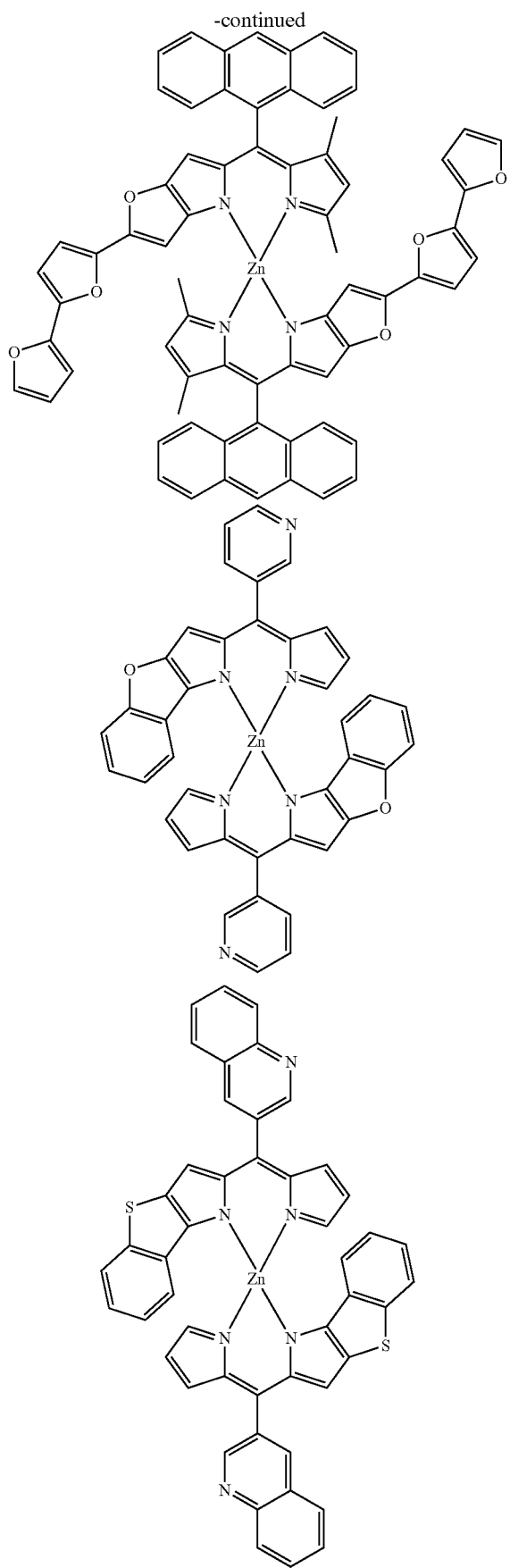
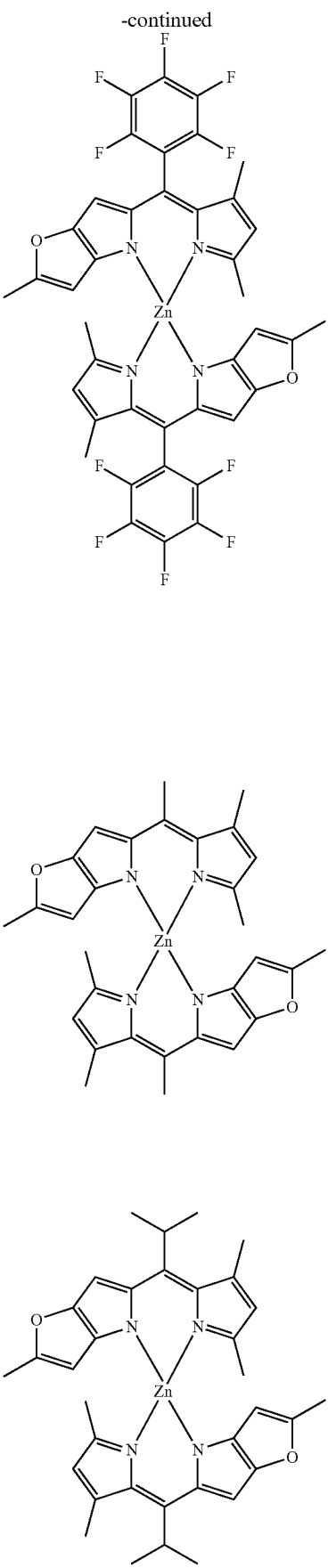

-continued

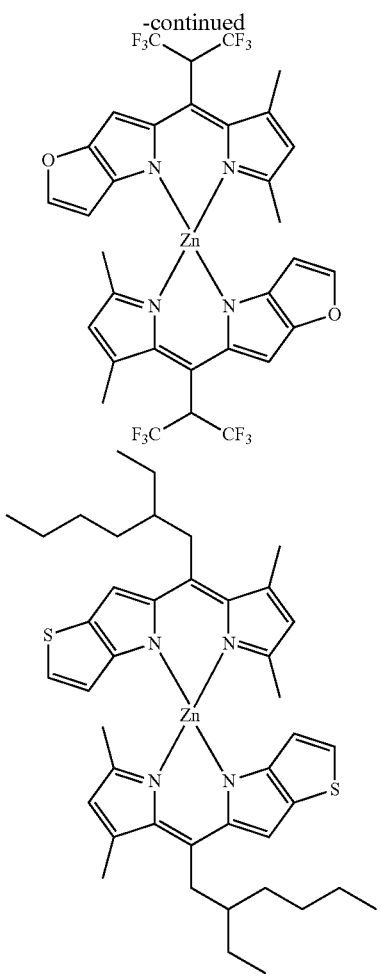

The compound represented by Formula (1) is preferably a compound in which an ionization potential in a single film is −5.0 to −6.0 eV from the viewpoints of stability in a case of using the compound as the p-type organic semiconductor and matching of energy levels between the compound and the n-type organic semiconductor.

The compound represented by Formula (1) is particularly useful as a material of the photoelectric conversion film used for the optical sensor, the imaging element, or a photoelectric cell. In addition, the compound represented by Formula (1) usually functions as the p-type organic semiconductor in the photoelectric conversion film in many cases. The compound represented by the formula (1) can also be used as a coloring material, a liquid crystal material, an organic semiconductor material, a charge transport material, a pharmaceutical material, and a fluorescent diagnostic material.

n-Type Organic Semiconductor

The photoelectric conversion film contains the n-type organic semiconductor as a component other than the compound represented by the above-mentioned Formula (1).

The n-type organic semiconductor is an acceptor-property organic semiconductor material (a compound), and refers to an organic compound having a property of easily accepting an electron. More specifically, the n-type organic semiconductor refers to an organic compound having a large electron affinity of two organic compounds used in contact with each other.

Examples of the n-type organic semiconductor include a condensed aromatic carbocyclic compound (for example, a naphthalene derivative, an anthracene derivative, a phenanthrene derivative, a tetracene derivative, a pyrene derivative, a perylene derivative, and a fluoranthene derivative); a 5 to 7 membered heterocyclic compound having at least one of a nitrogen atom, an oxygen atom, or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, and thiazole); a polyarylene compound; a fluorene compound; a cyclopentadiene compound; a silyl compound; and a metal complex having a nitrogen-containing heterocyclic compound as the ligands.

An organic dye may be used as the n-type organic semiconductor. Examples of the organic dye include a cyanine dye, a styryl dye, a hemicyanine dye, a merocyanine dye (including zeromethine merocyanine (simple merocyanine)), a rhodacyanine dye, an allopolar dye, an oxonol dye, a hemioxonol dye, a squarylium dye, a croconium dye, an azamethine dye, a coumarin dye, an arylidene dye, an anthraquinone dye, a triphenylmethane dye, an azo dye, an azomethine dye, a metallocene dye, a fluorenone dye, a flugide dye, a perylene dye, a phenazine dye, a phenothiazine dye, a quinone dye, a diphenylmethane dye, a polyene dye, an acridine dye, an acridinone dye, a diphenylamine dye, a quinophthalone dye, a phenoxazine dye, a phthaloperylene dye, a dioxane dye, a porphyrin dye, a chlorophyll dye, a phthalocyanine dye, and a metal complex dye.

The molecular weight of the n-type organic semiconductor described above is preferably 200 to 1200, and more preferably 200 to 900.

On the other hand, in a case of the form as shown in FIG. 2, it is desirable that the n-type organic semiconductor is colorless, or has the maximum absorption wavelength and/or an absorption waveform close to that of the compound represented by Formula (1), and a specific value of the maximum absorption wavelength of the n-type organic semiconductor is desirably 400 nm or less, or 500 to 600 nm.

It is preferable that the photoelectric conversion film has a bulk hetero structure formed in a state in which the compound represented by Formula (1) and the n-type organic semiconductor are mixed. The bulk hetero structure refers to a layer in which the compound represented by Formula (1) and the n-type organic semiconductor are mixed and dispersed in the photoelectric conversion film. The photoelectric conversion film having the bulk hetero structure can be formed by either a wet method or a dry method. The bulk hetero structure is described in detail in, for example, paragraphs [0013] to [0014] of JP2005-303266A.

The content of the compound represented by Formula (1) to the total content of the compound represented by Formula (1) and the n-type organic semiconductor (=film thickness in terms of single layer of compound represented by Formula (1)/(film thickness in terms of single layer of compound represented by Formula (1)+film thickness in terms of single layer of n-type organic semiconductor)×100) is preferably 20 to 80 volume %, more preferably 30 to 70 volume %, and still more preferably 40 to 60 volume % from the viewpoint of responsiveness of the photoelectric conversion element.

It is preferable that the photoelectric conversion film is substantially formed of the compound represented by Formula (1) and the n-type organic semiconductor. The term of "substantially" means that the total content of the compound represented by Formula (1) and the n-type organic semiconductor to the total mass of the photoelectric conversion film is 95 mass % or more.

The photoelectric conversion film containing the compound represented by Formula (1) is a non-luminescent film, and has a feature different from an organic light emitting diode (OLED). The non-luminescent film means a film having a luminescence quantum efficiency of 1% or less, and the luminescence quantum efficiency is preferably 0.5% or less, and more preferably 0.1% or less.

Film Formation Method

The photoelectric conversion film can be formed mostly by a dry film formation method. Specific examples of the dry film formation method include a physical vapor deposition method such as a vapor deposition method (in particular, a vacuum evaporation method), a sputtering method, an ion plating method, and molecular beam epitaxy (MBE), and chemical vapor deposition (CVD) such as plasma polymerization. Among these, the vacuum evaporation method is preferable. In a case where the photoelectric conversion film is formed by the vacuum evaporation method, a producing condition such as a degree of vacuum and a vapor deposition temperature can be set according to the normal method.

The thickness of the photoelectric conversion film is preferably 10 to 1000 nm, more preferably 50 to 800 nm, still more preferably 50 to 500 nm, and particularly preferably 50 to 300 nm.

Electrode

The electrode (the upper electrode (the transparent conductive film) 15 and the lower electrode (the conductive film) 11) is formed of a conductive material. Examples of the conductive material include metals, alloys, metal oxides, electrically conductive compounds, and mixtures thereof.

Since light is incident through the upper electrode 15, the upper electrode 15 is preferably transparent to light to be detected. Examples of the material forming the upper electrode 15 include conductive metal oxides such as tin oxide (ATO, FTO) doped with antimony, fluorine, or the like, tin oxide, zinc oxide, indium oxide, indium tin oxide (ITO), and indium zinc oxide (IZO); metal thin films such as gold, silver, chromium, and nickel, mixtures or laminates of these metals and the conductive metal oxides; and organic conductive materials such as polyaniline, polythiophene, and polypyrrole. Among these, conductive metal oxides are preferable from the viewpoints of high conductivity, transparency, and the like.

In general, in a case where the conductive film is made to be thinner than a certain range, a resistance value is rapidly increased. However, in the solid-state imaging element into which the photoelectric conversion element according to the present embodiment is incorporated, the sheet resistance is preferably 100 to 10000 Ω/□, and the degree of freedom of the range of the film thickness that can be thinned is large. In addition, as the thickness of the upper electrode (the transparent conductive film) 15 is thinner, the amount of light that the upper electrode absorbs becomes smaller, and the light transmittance usually increases. The increase in the light transmittance causes an increase in light absorbance in the photoelectric conversion film and an increase in the photoelectric conversion ability, which is preferable. Considering the suppression of leakage current, an increase in the resistance value of the thin film, and an increase in transmittance accompanied by the thinning, the film thickness of the upper electrode 15 is preferably 5 to 100 nm, and more preferably 5 to 20 nm.

There is a case where the lower electrode 11 has transparency or an opposite case where the lower electrode does not have transparency and reflects light, depending on the application. Examples of a material constituting the lower electrode 11 include conductive metal oxides such as tin oxide (ATO, FTO) doped with antimony, fluorine, or the like, tin oxide, zinc oxide, indium oxide, indium tin oxide (ITO), and indium zinc oxide (IZO); metals such as gold, silver, chromium, nickel, titanium, tungsten, and aluminum, conductive compounds (for example, titanium nitride (TiN)) such as oxides or nitrides of these metals; mixtures or laminates of these metals and conductive metal oxides; and organic conductive materials such as polyaniline, polythiophene, and polypyrrole.

The method of forming electrodes is not particularly limited, and can be appropriately selected in accordance with the electrode material. Specific examples thereof include a wet method such as a printing method and a coating method; a physical method such as a vacuum evaporation method, a sputtering method, and an ion plating method; and a chemical method such as a CVD method and a plasma CVD method.

In a case where the material of the electrode is ITO, examples thereof include an electron beam method, a sputtering method, a resistance thermal vapor deposition method, a chemical reaction method (such as a sol-gel method), and a coating method with a dispersion of indium tin oxide.

Charge Blocking Film: Electron Blocking Film and Positive Hole Blocking Film

It is also preferable that the photoelectric conversion element of the present invention has one or more interlayers between the conductive film and the transparent conductive film, in addition to the photoelectric conversion film. Example of the interlayer includes the charge blocking film. In the case where the photoelectric conversion element has this film, the characteristics (such as photoelectric conversion efficiency and responsiveness) of the photoelectric conversion element to be obtained become superior. Examples of the charge blocking film include the electron blocking film and the positive hole blocking film. Hereinafter, the films will be described in detail.

Electron Blocking Film

The electron blocking film includes an electron donating compound. Specific examples of a low molecular material include aromatic diamine compounds such as N,N'-bis(3-methylphenyl)-(1,1'-biphenyl)-4,4'-diamine (TPD) and 4,4'-bis[N-(naphthyl)-N-phenyl-amino]biphenyl (α-NPD); porphyrin compounds such as porphyrin, copper tetraphenylporphyrin, phthalocyanine, copper phthalocyanine, and titanium phthalocyanine oxide; oxazole, oxadiazole, triazole, imidazole, imidazolone, a stilbene derivative, a pyrazoline derivative, tetrahydroimidazole, polyarylalkane, butadiene, 4,4',4''-tris(N-(3-methylphenyl)-N-phenylamino)triphenylamine (m-MTDATA), a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, and a silazane derivative. Specific examples of a polymer material include a polymer such as phenylenevinylene, fluorene, carbazole, indole, pyrene, pyrrole, picoline, thiophene, acetylene, and diacetylene, or a derivative thereof. In addition, compounds described in paragraphs [0049] to [0063] of JP5597450B, compounds described in paragraphs [0119] to [0158] of JP2011-225544A, and compounds described in paragraphs [0086] to [0090] of JP2012-094660A are exemplified.

The electron blocking film may be configured by a plurality of films.

The electron blocking film may be formed of an inorganic material. In general, an inorganic material has a dielectric constant larger than that of an organic material. Therefore, in a case where the inorganic material is used in the electron blocking film, a large voltage is applied to the photoelectric conversion film. Therefore, the photoelectric conversion efficiency increases. Examples of the inorganic material that can be used in the electron blocking film include calcium oxide, chromium oxide, copper chromium oxide, manganese oxide, cobalt oxide, nickel oxide, copper oxide, copper gallium oxide, copper strontium oxide, niobium oxide, molybdenum oxide, copper indium oxide, silver indium oxide, and iridium oxide.

Positive Hole Blocking Film

The positive hole blocking film includes an electron accepting compound.

Examples of the electron accepting compound include an oxadiazole derivative such as 1,3-bis(4-tert-butylphenyl-1,3,4-oxadiazol)phenylene (OXD-7); an anthraquinodimethane derivative; a diphenylquinone derivative; bathocuproine, bathophenanthroline, and derivatives thereof; a triazole compound; a tris(8-hydroxyquinolinato)aluminum complex; a bis(4-methyl-8-quinolinato)aluminum complex; a distyrylarylene derivative; and a silole compound. In addition, compounds described in paragraphs [0056] to [0057] of JP2006-100767A are exemplified.

The method of producing the charge blocking film is not particularly limited, a dry film formation method and a wet film formation method are exemplified. Examples of the dry film formation method include a vapor deposition method and a sputtering method. The vapor deposition method may be any of physical vapor deposition (PVD) and chemical vapor deposition (CVD), and physical vapor deposition such as vacuum evaporation is preferable. Examples of the wet film formation method include an inkjet method, a spray method, a nozzle printing method, a spin coating method, a dip coating method, a casting method, a die coating method, a roll coating method, a bar coating method, and a gravure coating method, and an inkjet method is preferable from the viewpoint of high precision patterning.

Each thickness of the charge blocking films (the electron blocking film and the positive hole blocking film) is preferably 3 to 200 nm, more preferably 5 to 100 nm, and still more preferably 5 to 30 nm.

Substrate

The photoelectric conversion element may further include a substrate. The type of substrate to be used is not particularly limited, and a semiconductor substrate, a glass substrate, and a plastic substrate are exemplified.

The position of the substrate is not particularly limited, but in general, the conductive film, the photoelectric conversion film, and the transparent conductive film are laminated on the substrate in this order.

Sealing Layer

The photoelectric conversion element may further include a sealing layer. The performance of the photoelectric conversion material may deteriorate noticeably due to the presence of deterioration factors such as water molecules. The deterioration can be prevented by sealing and coating the entirety of the photoelectric conversion film with the sealing layer such as diamond-like carbon (DLC) or ceramics such as metal oxide, metal nitride, and metal nitride oxide which are dense and into which water molecules do not permeate.

The material of the sealing layer may be selected and the sealing layer may be produced according to the description in paragraphs [0210] to [0215] of JP2011-082508A.

Optical Sensor

Examples of the application of the photoelectric conversion element include the photoelectric cell and the optical sensor, but the photoelectric conversion element of the present invention is preferably used as the optical sensor. The photoelectric conversion element may be used alone as the optical sensor. Alternately, the photoelectric conversion element may be used as a line sensor in which the photoelectric conversion elements are linearly arranged or as a two-dimensional sensor in which the photoelectric conversion elements are planarly arranged. In the line sensor, the photoelectric conversion element of the present invention functions as the imaging element by converting optical image information into an electric signal using an optical system such as a scanner, and a driving unit. In the two-dimensional sensor, the photoelectric conversion element of the present invention functions as the imaging element by converting the optical image information into the electric signal by imaging the optical image information on the sensor using the optical system such as an imaging module.

Imaging Element

Next, a configuration example of an imaging element comprising the photoelectric conversion element 10a will be described.

In the configuration example which will be described below, the same reference numerals or the corresponding reference numerals are attached to members or the like having the same configuration or action as those which have already been described, to simplify or omit the description.

The imaging element is an element that converts optical information of an image into the electric signal, and is an element in which a plurality of photoelectric conversion elements are arranged on a matrix in the same plane, optical signals are converted into electric signals in each photoelectric conversion element (pixel), and the electric signals can be sequentially output to the outside of the imaging elements for each pixel. For this reason, one pixel is formed of one photoelectric conversion element and one or more transistors.

Figure 3:
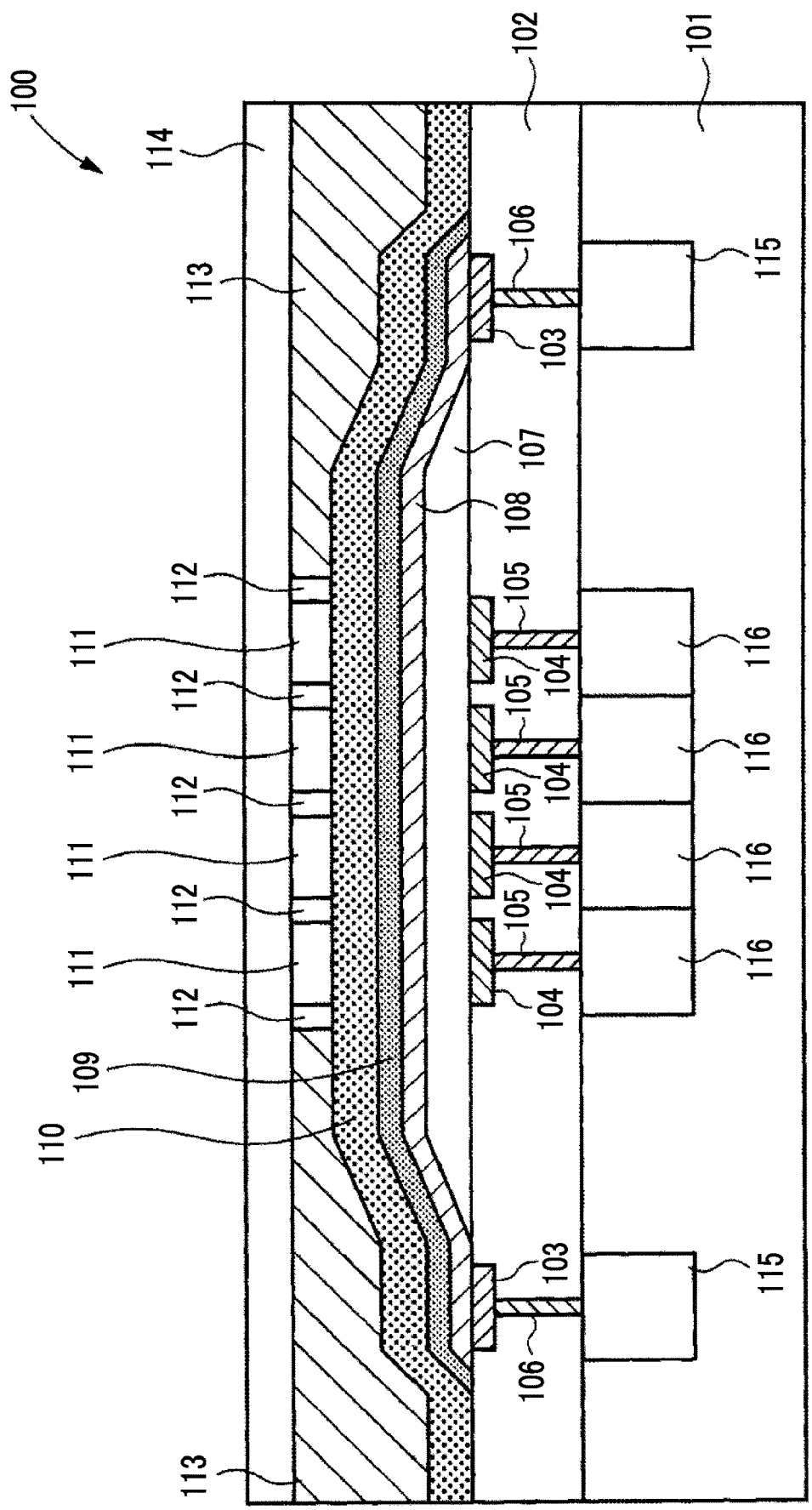
FIG. 3 is a schematic cross-sectional view of one pixel of an imaging element.

FIG. 3 is a schematic cross-sectional view showing a schematic configuration of an imaging element for describing an embodiment of the present invention. This imaging element is mounted on an imaging device such as a digital camera and a digital video camera, and imaging modules such as an electronic endoscope and a cellular phone.

The imaging element has a plurality of photoelectric conversion elements having configurations shown in FIG. 1A and a circuit substrate in which the readout circuit reading out signals corresponding to charges generated in the photoelectric conversion film of each photoelectric conversion element is formed. The imaging element has a configuration in which the plurality of photoelectric conversion elements are one-dimensionally or two-dimensionally arranged on the same surface above the circuit substrate.

An imaging element 100 shown in FIG. 3 comprises a substrate 101, an insulating layer 102, connection electrodes 103, pixel electrodes (lower electrodes) 104, connection units 105, connection units 106, a photoelectric conversion film 107, a counter electrode (upper electrode) 108, a buffer layer 109, a sealing layer 110, a color filter (CF) 111, partition walls 112, a light shielding layer 113, a protective layer 114, a counter electrode voltage supply unit 115, and readout circuits 116.

The pixel electrode 104 has the same function as the lower electrode 11 of the photoelectric conversion element 10a shown in FIG. 1A. The counter electrode 108 has the same function as the upper electrode 15 of the photoelectric conversion element 10a shown in FIG. 1A. The photoelectric conversion film 107 has the same configuration as a layer provided between the lower electrode 11 and the upper electrode 15 of the photoelectric conversion element 10a shown in FIG. 1A.

The substrate 101 is a semiconductor substrate such as the glass substrate, or Si. The insulating layer 102 is formed on the substrate 101. A plurality of pixel electrodes 104 and a plurality of connection electrodes 103 are formed on the surface of the insulating layer 102.

The photoelectric conversion film 107 is a layer common to all the photoelectric conversion elements provided so as to cover the plurality of pixel electrodes 104.

The counter electrode 108 is one electrode common to all the photoelectric conversion elements provided on the photoelectric conversion film 107. The counter electrode 108 is formed on the connection electrodes 103 arranged on an outer side than the photoelectric conversion film 107, and is electrically connected to the connection electrodes 103.

The connection units 106 are buried in the insulating layer 102, and are plugs for electrically connecting the connection electrodes 103 to the counter electrode voltage supply unit 115. The counter electrode voltage supply unit 115 is formed in the substrate 101, and applies a predetermined voltage to the counter electrode 108 via the connection units 106 and the connection electrodes 103. In a case where a voltage to be applied to the counter electrode 108 is higher than a power supply voltage of the imaging element, the power supply voltage is boosted by a boosting circuit such as a charge pump to supply the predetermined voltage.

The readout circuits 116 are provided on the substrate 101 corresponding to each of the plurality of pixel electrodes 104, and read out signals corresponding to charges trapped by the corresponding pixel electrodes 104. The readout circuits 116 are configured, for example, of CCD and CMOS circuits, or a thin film transistor (TFT) circuit, and are shielded by the light shielding layer not shown in the drawing which is disposed in the insulating layer 102. The readout circuits 116 are electrically connected to the corresponding the pixel electrodes 104 via the connection units 105.

The buffer layer 109 is formed on the counter electrode 108 so as to cover the counter electrode 108. The sealing layer 110 is formed on the buffer layer 109 so as to cover the buffer layer 109. The color filters 111 are formed on the sealing layer 110 at positions corresponding to each of the pixel electrodes 104. The partition walls 112 are provided between the color filters 111, and are used for improving the light transmittance of the color filters 111.

The light shielding layer 113 is formed on the sealing layer 110 in a region other than the region where the color filters 111 and the partition walls 112 are provided, and prevents light from being incident to the photoelectric conversion film 107 formed outside an effective pixel region. The protective layer 114 is formed on the color filters 111, the partition walls 112, and the light shielding layer 113, and protects the entirety of the imaging element 100.

In the imaging element 100 configured as described above, light which has entered is incident on the photoelectric conversion film 107, and charges are generated in the photoelectric conversion film. The positive holes among the generated charges are trapped by the pixel electrodes 104, and voltage signals corresponding to the amount are output to the outside of the imaging element 100 using the readout circuits 116.

A method of producing the imaging element 100 is as follows. The connection units 105 and 106, the plurality of connection electrodes 103, the plurality of pixel electrodes 104, and the insulating layer 102 are formed on the circuit substrate in which the counter electrode voltage supply unit 115 and the readout circuits 116 are formed. The plurality of pixel electrodes 104 are disposed, for example, on the surface of the insulating layer 102 in a square lattice shape.

Next, the photoelectric conversion film 107 is formed on the plurality of pixel electrodes 104, for example, by the vacuum evaporation method. Next, the counter electrode 108 is formed on the photoelectric conversion film 107 under vacuum, for example, by the sputtering method. Next, the buffer layer 109 and the sealing layer 110 are sequentially formed on the counter electrode 108, for example, by the vacuum evaporation method. Next, after the color filters 111, the partition walls 112, and the light shielding layer 113 are formed, the protective layer 114 is formed, and the production of the imaging element 100 is completed.

EXAMPLES

Examples will be shown below, but the present invention is not limited thereto.

Synthesis of Compound (D-1)

A compound (D-1) was synthesized according to the following scheme.

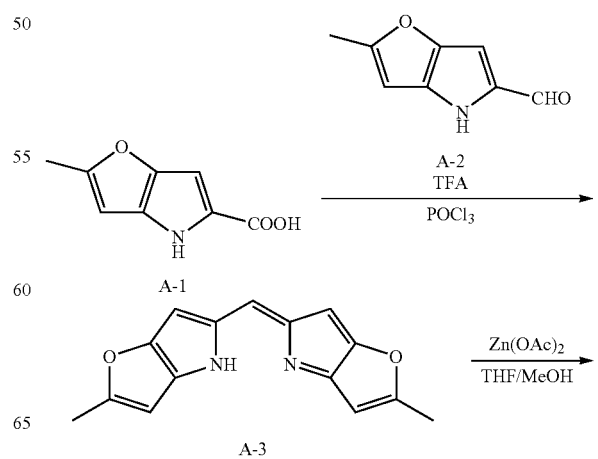

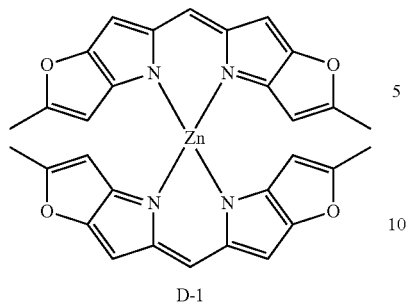

D-1

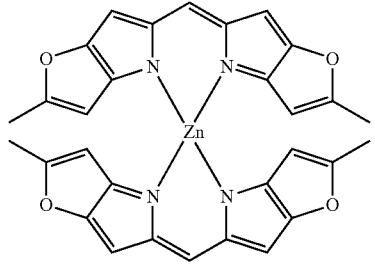

D-1

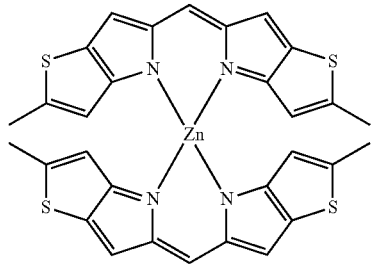

D-2

A compound (A-1) and a compound (A-2) were synthesized according to a method described in Journal of American Chemical Society, 2008, 130, 1550-1551.

Trifluoroacetic acid (TFA) (3.3 mL) was added to the compound (A-1) (554 mg, 3.35 mmol), and the obtained mixed liquid was reacted at 45° C. for 10 minutes. The compound (A-2) (500 mg, 3.35 mmol) was added to the mixed liquid, and phosphorus oxychloride (1.1 mL) was further added. The obtained mixed liquid was reacted at 45° C. for 15 minutes. After the mixed liquid was allowed to cool, the mixed liquid was added to a saturated aqueous sodium hydrogen carbonate solution (100 mL), and the obtained mixed liquid was stirred for 10 minutes. The solid precipitated in the mixed liquid was filtered off, and the obtained solid was washed with water. The washed solid was vacuum dried at 80° C. to obtain a compound (A-3).

The obtained compound (A-3) (630 mg) was dissolved in a mixed liquid of tetrahydrofuran (THF) (34 mL) and methanol (MeOH) (34 mL), and zinc acetate dihydrate (Zn(OAc)$_2$) (441 mg, 2.01 mmol) was further added to the mixed liquid. The mixed liquid was reacted at room temperature for 30 minutes. The mixed liquid was concentrated, the obtained crude product was purified by silica gel column (eluant: chloroform), and the purified compound was recrystallized from methanol to obtain a compound (D-1) (231 mg, 0.41 mmol, yield 24%).

The obtained compound (D-1) was identified by nuclear magnetic resonance (NMR) and mass spectrometry (MS).

Figure 4:
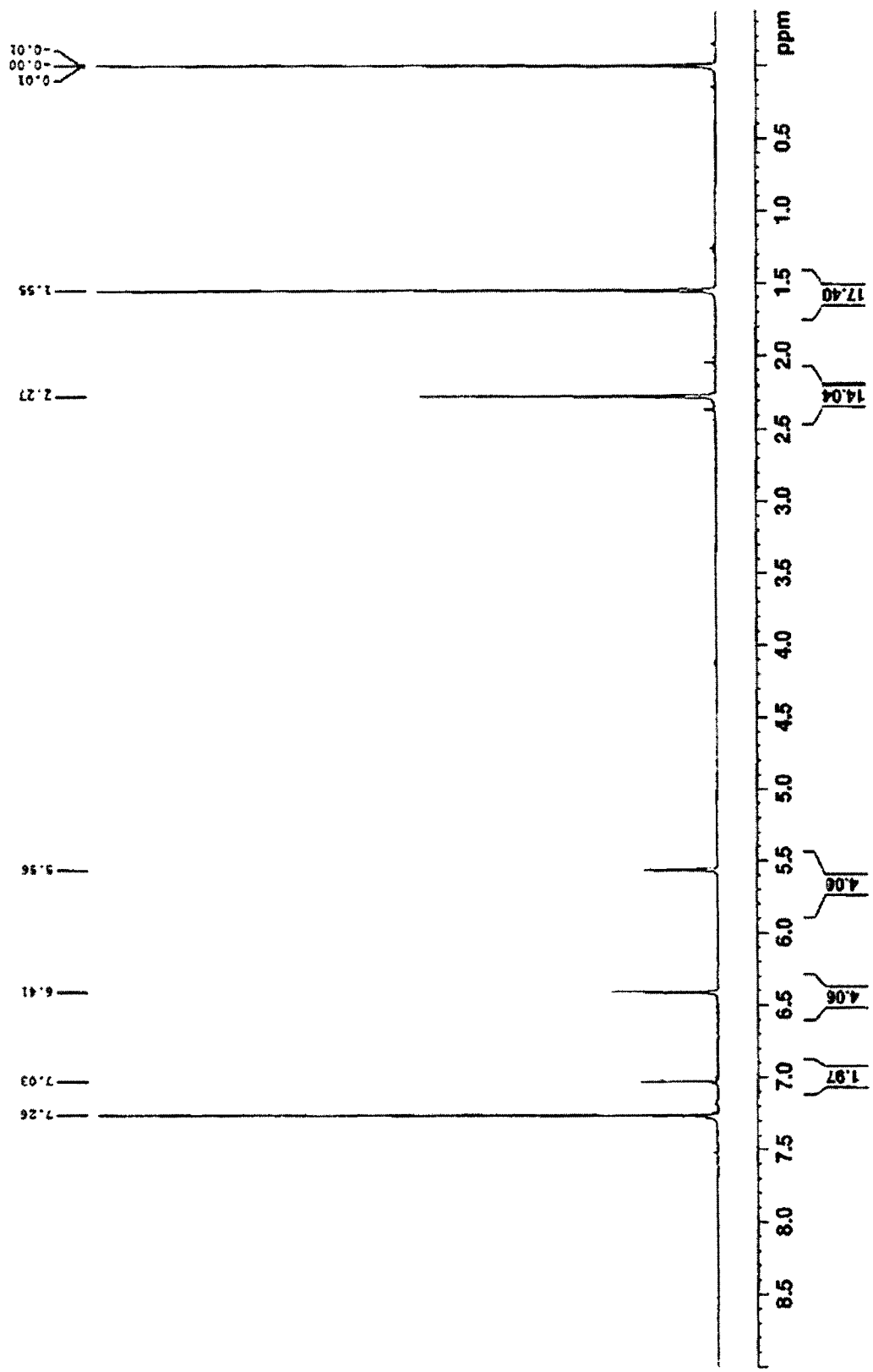
FIG. 4 is a $^1$H nuclear magnetic resonance (NMR) chart of a compound (D-1).

$^1$H NMR spectrum (400 MHz, CDCl$_3$) is shown in FIG. 4.

MS(ESI$^+$)m/z: 567.1 ([M+H]$^+$)

Hereinafter, compounds (D-2) to (D-11) and a comparative compound (R-4) were also synthesized using the same reaction.

Figure 5:
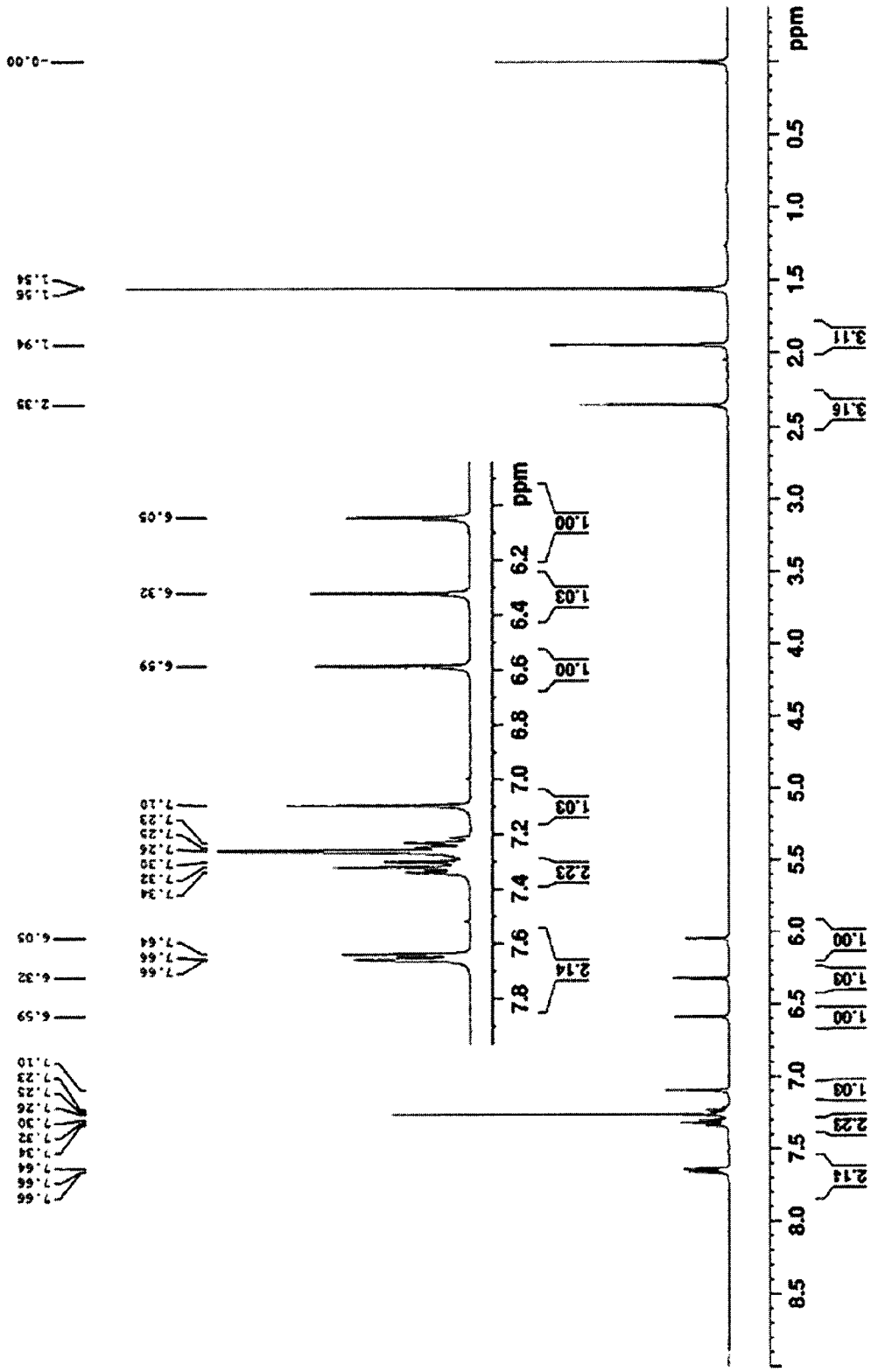
FIG. 5 is a $^1$H nuclear magnetic resonance (NMR) chart of a compound (D-5).
Figure 6:
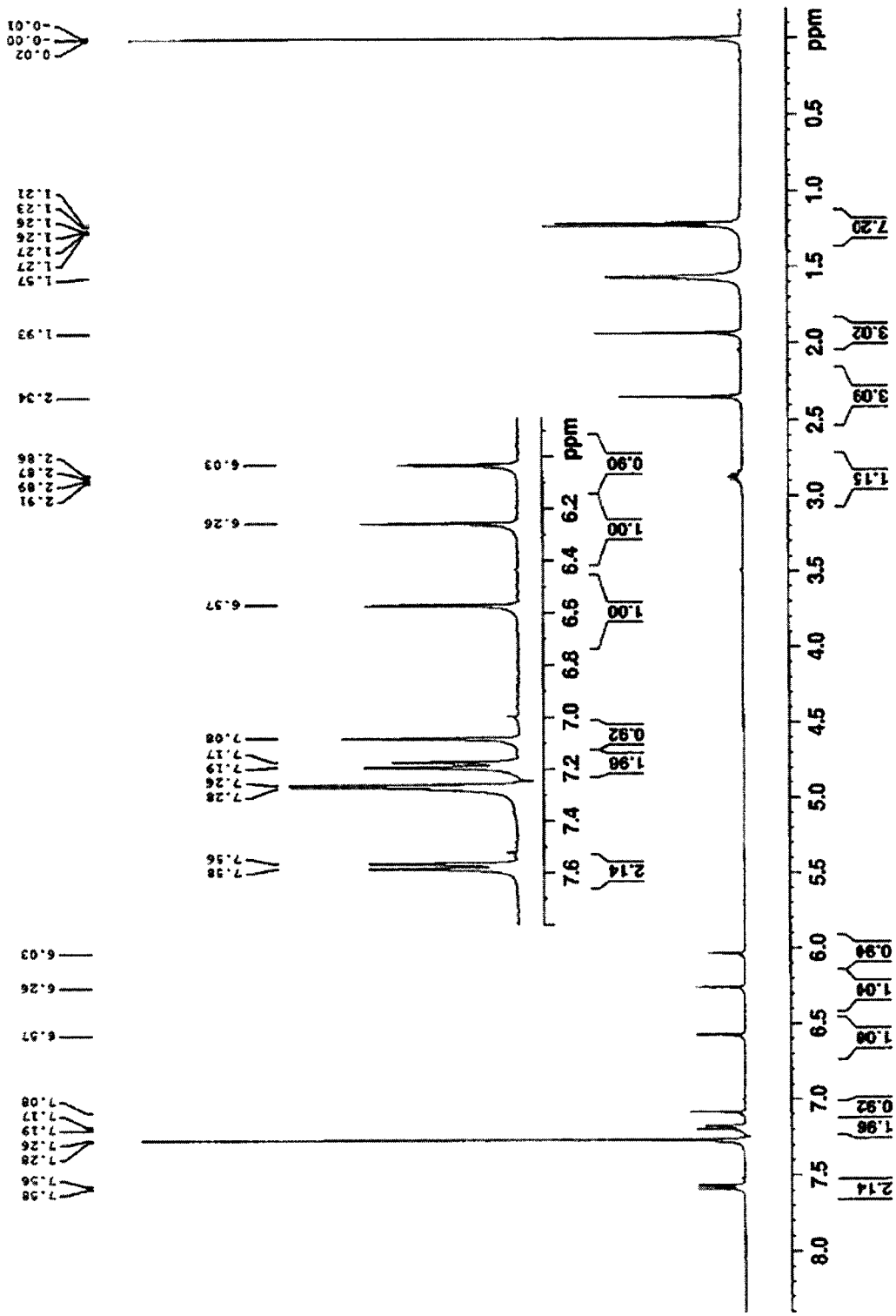
FIG. 6 is a $^1$H nuclear magnetic resonance (NMR) chart of a compound (D-7).

Also, the $^1$H NMR (solvent: CDCl$_3$) spectra of the compounds (D-5) to (D-7) are shown in FIG. 5 and FIG. 6.

The comparative compound (R-1) used as Comparative Example was purchased from Luminescence Technology.

A comparative compound (R-2) was synthesized according to the method described in Organic Biomolecular Chemistry, 2010, 8, 4546-4553.

A comparative compound (R-3) was synthesized according to a method described in Journal of American Chemical Society, 2008, 130, 1550-1551.

The structures of the obtained compounds (D-1) to (D-11) and the comparative compounds (R-1) to (R-4) are specifically shown below.

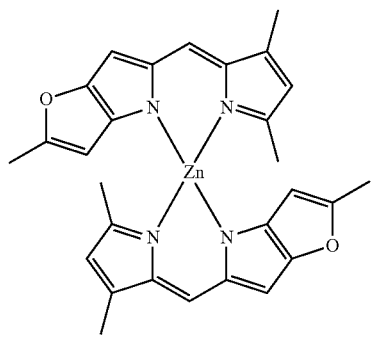

D-3

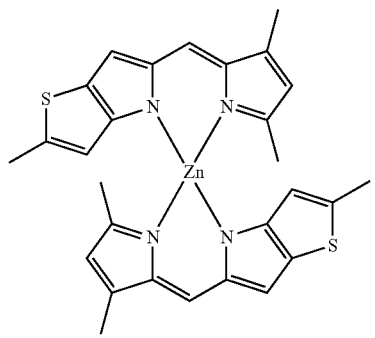

D-4

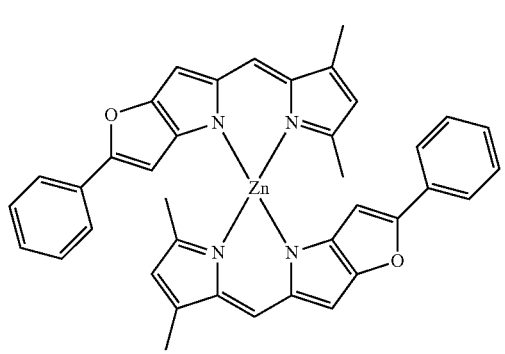

D-5

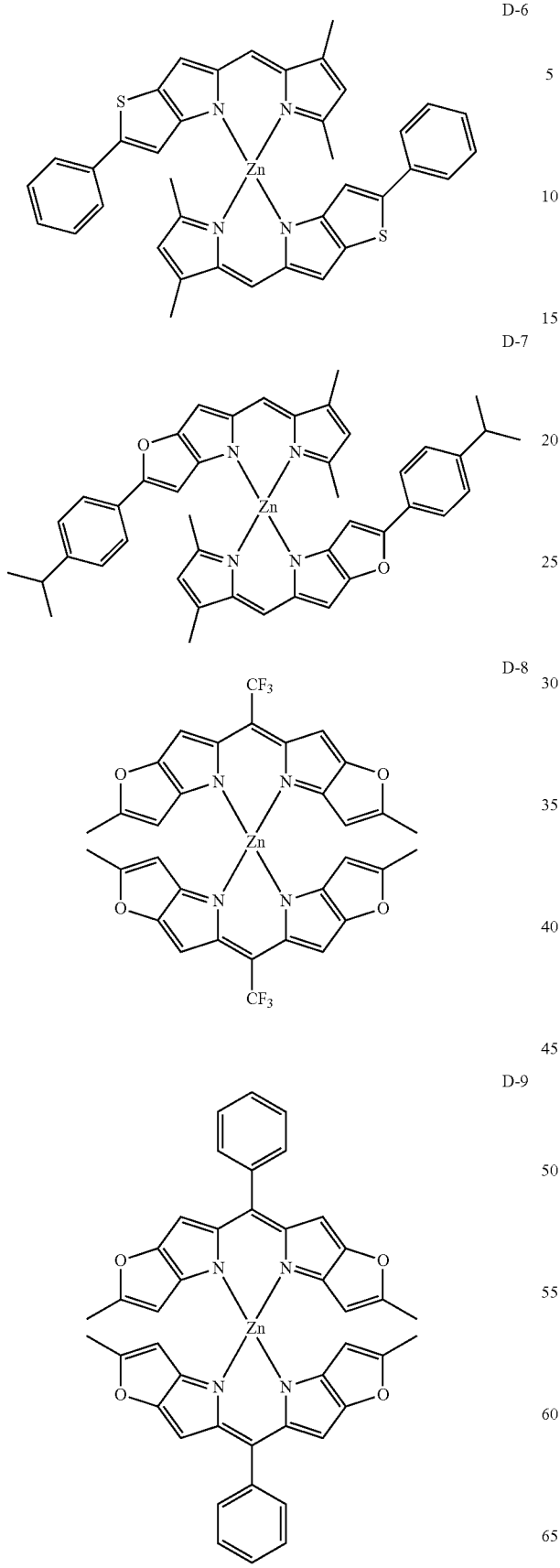
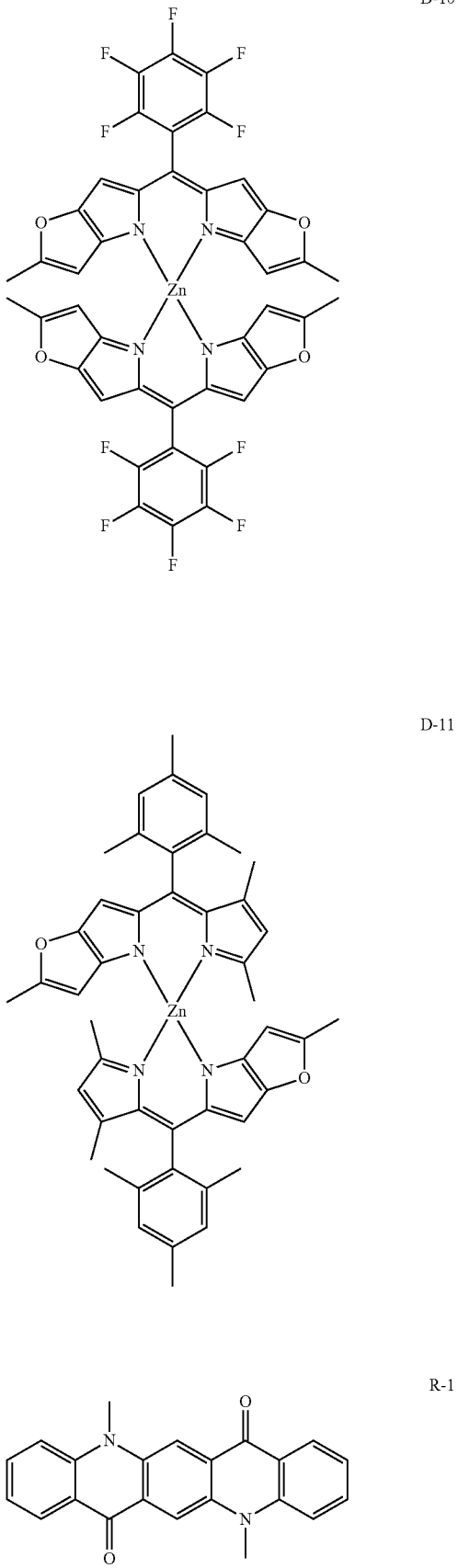

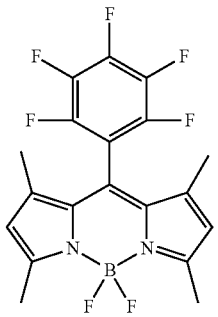

R-2

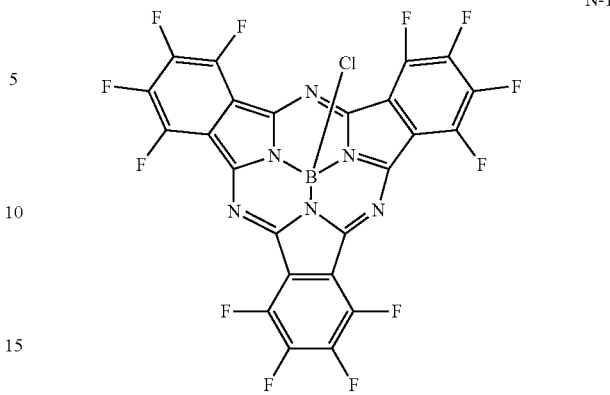

N-1

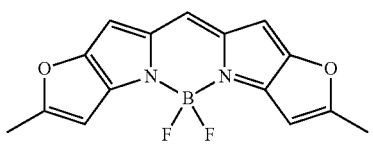

R-3

Production of Photoelectric Conversion Element

The photoelectric conversion element of the form of FIG. 1A was produced using the obtained compound. Hereinafter, a case where the compound (D-1) is used will be described in detail.

Specifically, an amorphous ITO film was formed on the glass substrate by the sputtering method to form the lower electrode 11 (a thickness: 30 nm). Furthermore, a film of molybdenum oxide ($MoO_x$) was formed on the lower electrode 11 by the vacuum evaporation method to form a molybdenum oxide layer (a thickness: 10 nm) as the electron blocking film 16A.

Furthermore, the compound (D-1), and the compound (N-1) described below were subjected to co-vapor deposition by the vacuum evaporation method so as to be respectively 50 nm in terms of single layer on a molybdenum oxide layer 16A to form a film in a state where the temperature of the substrate was controlled to 25° C., and the photoelectric conversion film 12 having the bulk hetero structure of 100 nm was formed.

Furthermore, amorphous ITO film was formed on the photoelectric conversion film 12 by the sputtering method to form the upper electrode 15 (the transparent conductive film) (a thickness: 10 nm). After a SiO film was formed on the upper electrode 15 by vacuum evaporation method as the sealing layer, an aluminum oxide ($Al_2O_3$) layer was formed on the SiO film by an atomic layer chemical vapor deposition (ALCVD) method to produce the photoelectric conversion element. The element is referred to as an element (A).

The photoelectric conversion element (the element (A)) of each example were produced according to the same procedure as described above except that the compound (D-1) was changed to each of the compounds (D-2) to (D-11), and the comparative compounds (R-1) and (R-4).

Evaluation

Evaluation of Responsiveness

The following evaluation of responsiveness was performed using each obtained photoelectric conversion element (the element (A)).

Specifically, a voltage was applied to the element (A) so as to have an intensity of $2.0 \times 10^5$ V/cm. Thereafter, light emitting diode (LED) was instantaneously turned on to radiate light from the upper electrode (the transparent conductive film) side, and the photocurrent at that time was measured with an oscilloscope to obtain a rise time to signal intensities of 0% to 97%, and the relative value when the rise time of the element (A) produced by using the comparative compound (R-1) was set to 10 was obtained.

Relative to comparative compound (R-1), a case where the relative value of the rise time is less than 3 was set as "A", a case of 3 or more and less than 5 was set as "B", a case of 5 or more and less than 10 was set as "C", and a case of 10 or more was set as "D". The results are shown in Table 1. For practical use, "A" or "B" is preferable, and "A" is more preferable.

Evaluation of Photoelectric Conversion Efficiency in Case of Thin Film

The photoelectric conversion element used for evaluating the photoelectric conversion efficiency in a case of a thin film was produced as in <Production of Photoelectric Conversion Element> described above except that the film thickness of the photoelectric conversion film was changed. Specifically, the compound (D-1) and the compound (N-1) were subjected to co-vapor deposition by the vacuum evaporation method so as to be respectively 30 nm in terms of single layer on a molybdenum oxide layer 16A to form a film, and the photoelectric conversion film 12 having the bulk hetero structure of 60 nm was formed to obtain the photoelectric conversion element.

Photoelectric conversion elements were similarly produced for each of the compounds (D-2) to (D-11), and the comparative compounds (R-1) to (R-4). The obtained photoelectric conversion element was used as an element (B).

A voltage of 3V was applied to the element (B), and the maximum value of the photoelectric conversion efficiency was measured. A value of the element (A) of the comparative compound (R-1) was set as 1 to obtain the relative value of the maximum value of the photoelectric conversion efficiency of each element (B).

A case where the relative value of the photoelectric conversion efficiency of the element (B) is 1.1 or more was set as "A", a case of 1.0 or more and less than 1.1 was set as "B", a case of 0.9 or more and less than 1.0 was set as "C", and a case of less than 0.9 was set as "D". The results are shown in Table 1. For practical use, "A" or "B" is preferable, and "A" is more preferable.

TABLE 1

| Compound | Responsiveness | Photoelectric conversion efficiency in case of thin film | Note |
|---|---|---|---|
| D-1 | A | A | Example 1 |
| D-2 | A | A | Example 2 |
| D-3 | A | A | Example 3 |
| D-4 | A | A | Example 4 |
| D-5 | B | A | Example 5 |
| D-6 | B | A | Example 6 |
| D-7 | B | A | Example 7 |
| D-8 | A | A | Example 8 |
| D-9 | A | A | Example 9 |
| D-10 | A | A | Example 10 |
| D-11 | B | B | Example 11 |
| R-1 | D | C | Comparative Example 1 |
| R-2 | D | D | Comparative Example 2 |
| R-3 | C | C | Comparative Example 3 |
| R-4 | C | C | Comparative Example 4 |

As shown in Table 1, it was confirmed that the photoelectric conversion element having the compound represented by Formula (1) exhibits both excellent responsiveness and excellent photoelectric conversion efficiency in a case of a thin film.

In Comparative Examples 1 to 4 in which a predetermined compound was not used, a desired effect was not obtained.

The comparative compound (R-1) used in Comparative Example 1 corresponds to the compound specifically disclosed in US2014/0097416A.

Production of Imaging Element

The same imaging element as shown in FIG. 3 was produced. That is, 30 nm of an amorphous TiN film was formed on a CMOS substrate by a sputtering method, and was used as the lower electrode through patterning such that each pixel was present on the photodiode (PD) on the CMOS substrate through photolithography, and then the imaging element was produced similarly to the element (A) and the element (B) after the film formation of the electron blocking material. Evaluations of responsiveness of each of the obtained imaging elements and the photoelectric conversion efficiency in a case where the photoelectric conversion film is a thin film were also carried out in the same manner, and the same results as those in Table 1 were obtained. Therefore, it was confirmed that the imaging element also exhibits excellent performance.

EXPLANATION OF REFERENCES 10a, 10b: photoelectric conversion element
11: conductive film (lower electrode)
12: photoelectric conversion film
15: transparent conductive film (upper electrode)
16A: electron blocking film
16B: positive hole blocking film
100: pixel separation type imaging element
101: substrate
102: insulating layer
103: connection electrode
104: pixel electrode (lower electrode)
105: connection unit
106: connection unit
107: photoelectric conversion film
108: counter electrode (upper electrode)
109: buffer layer
110: sealing layer
111: color filter (CF)
112: partition wall
113: light shielding layer
114: protective layer
115: counter electrode voltage supply unit
116: readout circuit
200: photoelectric conversion element (hybrid type photoelectric conversion element)
201: inorganic photoelectric conversion film
202: n-type well
203: p-type well
204: n-type well
205: p-type silicon substrate
207: insulating layer
208: pixel electrode
209: organic photoelectric conversion film
210: common electrode
211: protective film
212: electron blocking film

What is claimed is:
1. A photoelectric conversion element comprising:
a conductive film;
a photoelectric conversion film; and
a transparent conductive film, in this order,
wherein the photoelectric conversion film contains a compound represented by Formula (1), and an n-type organic semiconductor,

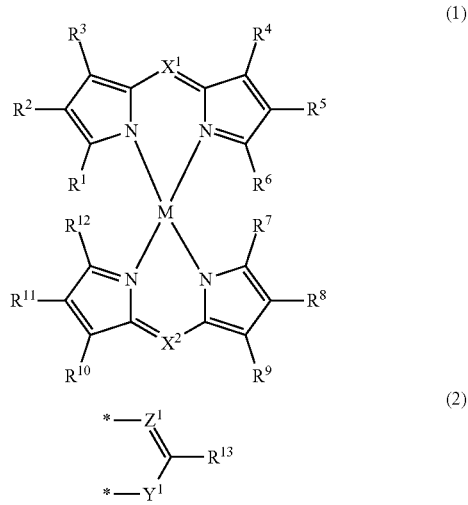

in Formulae (1) and (2), $R^1$ to $R^{13}$ each independently represent a hydrogen atom or a substituent, $X^1$ and $X^2$ each independently represent a nitrogen atom or $CR^{14}$, M represents a divalent metal atom, at least one set of $R^1$ and $R^2$, $R^5$ and $R^6$, $R^7$ and $R^8$, or $R^{11}$ and $R^{12}$ bonds to a structure represented by Formula (2) to form a ring, in Formula (2), $Y^1$ represents an oxygen atom, a sulfur atom, a selenium atom, $NR^{15}$, $CR^{16}R^{17}$, or —$CR^{18}$=$CR^{19}$—, $Z^1$ represents a nitrogen atom or $CR^{20}$, $R^{14}$ to $R^{20}$ each independently represent a hydrogen atom or a substituent, * represents a binding site, and in a case where $Z^1$ represents $CR^{20}$, $R^{20}$ and $R^{13}$ may bond to each other to form a ring.

2. The photoelectric conversion element according to claim 1,
wherein M represents Zn, Cu, Co, Ni, Pt, Pd, Mg, or Ca.

3. The photoelectric conversion element according to claim 1,
wherein the compound represented by Formula (1) is a compound represented by any of Formulae (3) to (6) described below,

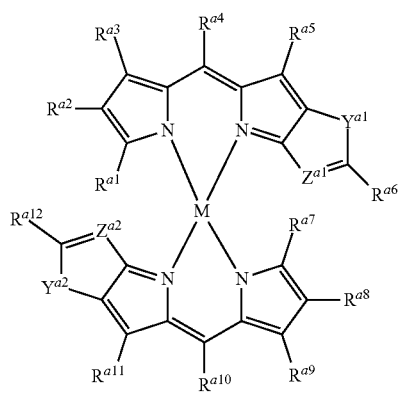
(3)

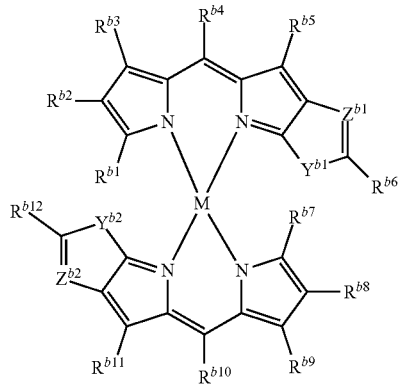
(4)

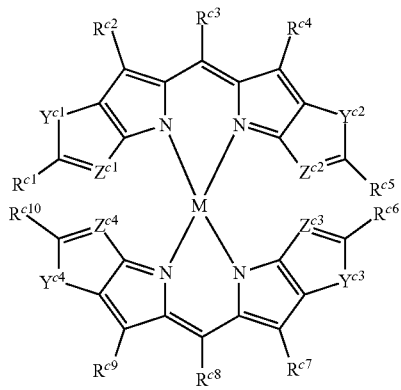
(5)

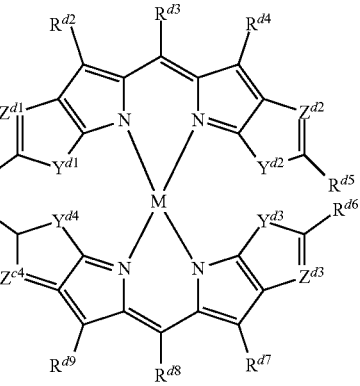
(6)

in Formulae (3) to (6), $R^{a1}$ to $R^{a12}$, $R^{b1}$ to $R^{b12}$, $R^{c1}$ to $R^{c10}$, and $R^{d1}$ to $R^{d10}$ each independently represent a hydrogen atom, an alkyl group, an aryl group, or a heteroaryl group, M represents Zn, Cu, Co, Ni, Pt, Pd, Mg, or Ca, $Y^{a1}$, $Y^{a2}$, $Y^{b1}$, $Y^{b2}$, $Y^{c1}$, $Y^{c2}$, $Y^{c3}$, $Y^{c4}$, $Y^{d1}$, $Y^{d2}$, $Y^{d3}$, and $Y^{d4}$ each independently represent an oxygen atom, a sulfur atom, a selenium atom, $NR^{21}$, $CR^{22}R^{23}$, or —$CR^{24}$=$CR^{25}$—, $Z^{a1}$, $Z^{a2}$, $Z^{b1}$, $Z^{b2}$, $Z^{c1}$, $Z^{c2}$, $Z^{c3}$, $Z^{c4}$, $Z^{d1}$, $Z^{d2}$, $Z^{d3}$, and $Z^{d4}$ each independently represent a nitrogen atom or $CR^{26}$, $R^{21}$ to $R^{26}$ each independently represent a hydrogen atom, an alkyl group, an aryl group, or a heteroaryl group, in a case where $Z^{a1}$ represents $CR^{26}$, $R^{26}$ and $R^{a6}$ may bond to each other to form a ring, in a case where $Z^{a2}$ represents $CR^{26}$, $R^{26}$ and $R^{a12}$ may bond to each other to form a ring, in a case where $Z^{b1}$ represents $CR^{26}$, $R^{26}$ and $R^{b6}$ may bond to each other to form a ring, in a case where $Z^{b2}$ represents $CR^{26}$, $R^{26}$ and $R^{b12}$ may bond to each other to form a ring, in a case where $Z^{c1}$ represents $CR^{26}$, $R^{26}$ and $R^{c1}$ may bond to each other to form a ring, in a case where $Z^{c2}$ represents $CR^{26}$, $R^{26}$ and $R^{c5}$ may bond to each other to form a ring, in a case where $Z^{c3}$ represents $CR^{26}$, $R^{26}$ and $R^{c6}$ may bond to each other to form a ring, in a case where $Z^{c4}$ represents $CR^{26}$, $R^{26}$ and $R^{c10}$ may bond to each other to form a ring, in a case where $Z^{d1}$ represents $CR^{26}$, $R^{26}$ and $R^{d1}$ may bond to each other to form a ring, in a case where $Z^{d2}$ represents $CR^{26}$, $R^{26}$ and $R^{d5}$ may bond to each other to form a ring, in a case where $Z^{d3}$ represents $CR^{26}$, $R^{26}$ and $R^{d6}$ may bond to each other to form a ring, and in a case where $Z^{d4}$ represents $CR^{26}$, $R^{26}$ and $R^{d10}$ may bond to each other to form a ring.

4. The photoelectric conversion element according to claim 3,
wherein $Y^{a1}$, $Y^{a2}$, $Y^{b1}$, $Y^{b2}$, $Y^{c1}$, $Y^{c2}$, $Y^{c3}$, $Y^{c4}$, $Y^{d1}$, $Y^{d2}$, $Y^{d3}$, and $Y^{d4}$ each independently represent an oxygen atom or a sulfur atom.

5. The photoelectric conversion element according to claim 3,
wherein $Z^{a1}$, $Z^{a2}$, $Z^{b1}$, $Z^{b2}$, $Z^{c1}$, $Z^{c2}$, $Z^{c3}$, $Z^{c4}$, $Z^{d1}$, $Z^{d2}$, $Z^{d3}$, and $Z^{d4}$ represent $CR^{26}$, and
$R^{26}$ represents a hydrogen atom, an alkyl group, an aryl group, or a heteroaryl group.

6. The photoelectric conversion element according to claim 3,
wherein M is Zn.

7. The photoelectric conversion element according to claim 3,
wherein a molecular weight of the compound represented by any of Formulae (3) to (6) is 1200 or less.

8. The photoelectric conversion element according to claim 1,
wherein a molecular weight of the n-type organic semiconductor is 200 to 1200.

9. The photoelectric conversion element according to claim 1,
wherein the photoelectric conversion film has a bulk hetero structure.

10. The photoelectric conversion element according to claim 1, further comprising one or more interlayers between the conductive film and the transparent conductive film, in addition to the photoelectric conversion film.

11. An optical sensor comprising the photoelectric conversion element according to claim 1.

12. An imaging element comprising the photoelectric conversion element according to claim 1.

13. A compound represented by any of Formulae (7) to (10),

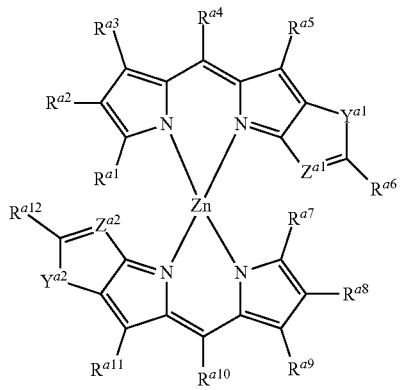

(7)

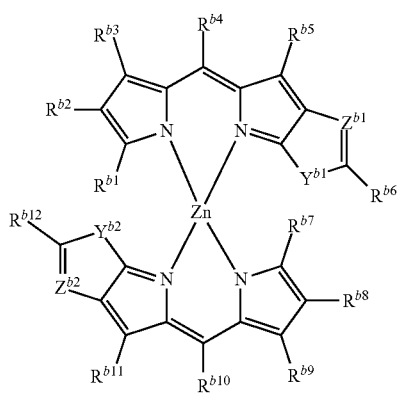

(8)

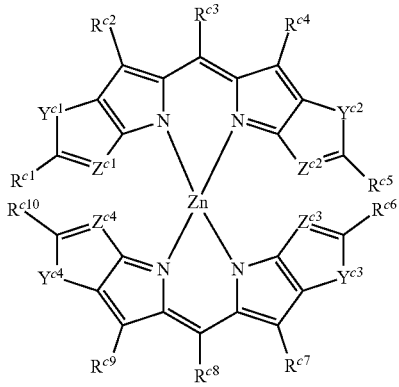

(9)

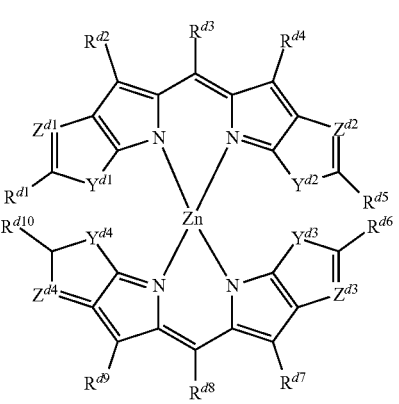

(10)

in Formulae (7) to (10), $R^{a1}$ to $R^{a12}$, $R^{b1}$ to $R^{b12}$, $R^{c1}$ to $R^{c10}$, and $R^{d1}$ to $R^{d10}$ each independently represent a hydrogen atom, an alkyl group, an aryl group, or a heteroaryl group, $Y^{a1}$, $Y^{a2}$, $Y^{b1}$, and $Y^{b2}$ each independently represent an oxygen atom, a sulfur atom, a selenium atom, $NR^{21}$, or $CR^{22}R^{23}$, $Y^{c1}$, $Y^{c2}$, $Y^{c3}$, $Y^{c4}$, $Y^{d1}$, $Y^{d2}$, $Y^{d3}$, and $Y^{d4}$ each independently represent an oxygen atom, a sulfur atom, a selenium atom, $NR^{21}$, $CR^{22}R^{23}$, or $-CR^{24}=CR^{25}-$, $Z^{a1}$, $Z^{a2}$, $Z^{b1}$, $Z^{b2}$, $Z^{c1}$, $Z^{c2}$, $Z^{c3}$, $Z^{c4}$, $Z^{d1}$, $Z^{d2}$, $Z^{d3}$, and $Z^{d4}$ each independently represent a nitrogen atom or $CR^{26}$, $R^{21}$ to $R^{26}$ each independently represent a hydrogen atom, an alkyl group, an aryl group, or a heteroaryl group, in a case where $Z^{a1}$ represents $CR^{26}$, $R^{26}$ and $R^{a6}$ may bond to each other to form a ring, in a case where $Z^{a2}$ represents $CR^{26}$, $R^{26}$ and $R^{a12}$ may bond to each other to form a ring, in a case where $Z^{b1}$ represents $CR^{26}$, $R^{26}$ and $R^{b6}$ may bond to each other to form a ring, in a case where $Z^{b2}$ represents $CR^{26}$, $R^{26}$ and $R^{b12}$ may bond to each other to form a ring, in a case where $Z^{c1}$ represents $CR^{26}$, $R^{26}$ and $R^{c1}$ may bond to each other to form a ring, in a case where $Z^{c2}$ represents $CR^{26}$, $R^{26}$ and $C^{c5}$ may bond to each other to form a ring, in a case where $Z^{c3}$ represents $CR^{26}$, $R^{26}$ and $R^{c6}$ may bond to each other to form a ring, in a case where $Z^{c4}$ represents $CR^{26}$, $R^{26}$ and $R^{c10}$ may bond to each other to form a ring, in a case where $Z^{d1}$ represents $CR^{26}$, $R^{26}$ and $R^{d1}$ may bond to each other to form a ring, in a case where $Z^{d2}$ represents $CR^{26}$, $R^{26}$ and $R^{d5}$ may bond to each other to form a ring, in a case where $Z^{d3}$ represents $CR^{26}$, $R^{26}$ and $R^{d6}$ may bond to each other to form a ring, and in a case where $Z^{d4}$ represents $CR^{26}$, $R^{26}$ and $R^{d10}$ may bond to each other to form a ring.

14. The photoelectric conversion element according to claim 2,
   wherein a molecular weight of the n-type organic semiconductor is 200 to 1200.

15. The photoelectric conversion element according to claim 2,
   wherein the photoelectric conversion film has a bulk hetero structure.

16. The photoelectric conversion element according to claim 2, further comprising one or more interlayers between the conductive film and the transparent conductive film, in addition to the photoelectric conversion film.

17. An optical sensor comprising the photoelectric conversion element according to claim 2.

18. An imaging element comprising the photoelectric conversion element according to claim 2.

19. The photoelectric conversion element according to claim 3,
   wherein a molecular weight of the n-type organic semiconductor is 200 to 1200.

20. The photoelectric conversion element according to claim 3,
   wherein the photoelectric conversion film has a bulk hetero structure.

* * * * *